US009482950B2

(12) United States Patent
Kodama et al.

(10) Patent No.: US 9,482,950 B2
(45) Date of Patent: Nov. 1, 2016

(54) CURABLE COMPOSITION FOR IMPRINTS, PATTERN-FORMING METHOD AND PATTERN

(71) Applicant: FUJIFILM Corporation, Minato-ku, Tokyo (JP)

(72) Inventors: Kunihiko Kodama, Haibara-gun (JP); Yuichiro Goto, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 350 days.

(21) Appl. No.: 14/063,739

(22) Filed: Oct. 25, 2013

(65) Prior Publication Data

US 2014/0050900 A1 Feb. 20, 2014

Related U.S. Application Data

(63) Continuation of application No. PCT/JP2012/061167, filed on Apr. 26, 2012.

(30) Foreign Application Priority Data

Apr. 27, 2011 (JP) ................................. 2011-099583
Aug. 26, 2011 (JP) ................................. 2011-184530

(51) Int. Cl.
| | |
|---|---|
| G03F 7/075 | (2006.01) |
| B82Y 10/00 | (2011.01) |
| B82Y 40/00 | (2011.01) |
| G03F 7/00 | (2006.01) |
| C08F 22/40 | (2006.01) |
| C08F 30/08 | (2006.01) |
| G03F 7/027 | (2006.01) |

(52) U.S. Cl.
CPC ............. *G03F 7/0757* (2013.01); *B82Y 10/00* (2013.01); *B82Y 40/00* (2013.01); *C08F 22/40* (2013.01); *C08F 30/08* (2013.01); *G03F 7/0002* (2013.01); *G03F 7/027* (2013.01); *G03F 7/0755* (2013.01); *Y10T 428/24802* (2015.01)

(58) Field of Classification Search
CPC .............. Y10T 428/24802; Y10T 428/24851; G03F 7/0002
See application file for complete search history.

(56) References Cited

U.S. PATENT DOCUMENTS

| | | | |
|---|---|---|---|
| 3,558,741 A * | 1/1971 | Holub et al. .......... | C07F 7/0854 204/478 |
| 3,770,768 A | 11/1973 | Fujiwa et al. | |
| 5,032,108 A | 7/1991 | Taniguchi et al. | |
| 5,169,965 A | 12/1992 | Fujiwa et al. | |
| 5,198,509 A | 3/1993 | Fujiwa et al. | |
| 5,259,926 A | 11/1993 | Kuwabara et al. | |
| 5,338,879 A | 8/1994 | Fujiwa et al. | |
| 5,378,736 A | 1/1995 | Fujiwa et al. | |
| 5,772,905 A | 6/1998 | Chou | |
| 5,956,216 A | 9/1999 | Chou | |
| 6,187,886 B1 * | 2/2001 | Husson, Jr. ............... | B32B 7/04 428/473.5 |
| 7,198,968 B2 | 4/2007 | Chae et al. | |
| 7,312,534 B2 * | 12/2007 | delos Santos .......... | C09J 5/06 257/783 |
| 7,821,586 B2 | 10/2010 | Kim | |
| 2005/0142714 A1 | 6/2005 | Chae et al. | |
| 2005/0231669 A1 | 10/2005 | Kim | |
| 2011/0019307 A1 | 1/2011 | Arai et al. | |
| 2012/0135206 A1 | 5/2012 | Haraguchi et al. | |

FOREIGN PATENT DOCUMENTS

| | | |
|---|---|---|
| JP | 5-313106 A | 11/1993 |
| JP | 11-100378 A | 4/1999 |
| JP | 2906245 B2 | 6/1999 |
| JP | 2926262 B2 | 7/1999 |
| JP | 2004-240241 A | 8/2004 |
| JP | 2005-197699 A | 7/2005 |
| JP | 2005-301289 A | 10/2005 |
| JP | 2006-310565 A | 11/2006 |
| JP | 2008-105414 A | 5/2008 |
| JP | 2008-168480 A | 7/2008 |
| JP | 2009-259370 A | 11/2009 |
| JP | 2010-018753 A | 1/2010 |
| JP | 2010-031238 A | 2/2010 |
| JP | 2010-067621 A | 3/2010 |
| WO | 2010/137724 A1 | 12/2010 |

OTHER PUBLICATIONS

Stephen Y. Chou et al., "Imprint of sub-25 nm vias and trenches in polymers", Appl. Phys. Lett., Nov. 1995, pp. 3114-3116, vol. 67, No. 21.
M. Colburn et al., "Step and Flash Imprint Lithography: A New Approach to High-Resolution Patterning", SPIE 1999, pp. 379-389, vol. 3676.
Stephen C. Lapin, "Vinyl Ether Functionalized Urethane Oligomers: An Alternative to Acrylate Based Systems", Polymers Paint Colour Journal 1988, pp. 321-328, vol. 179, No. 4237.
"Jikken Kagaku Koza (The Course of Experimental Chemistry)" 20, Yukigosei (Organic Synthesis) II, 4th Edition, 1992, Published by Maruzen Co., Ltd., pp. 213-224.
Yoshimura, Seccaku, 1985, pp. 32-39, vol. 29, No. 12.
Yoshimura, Seccaku, 1986, pp. 42-47, vol. 30, No. 5.
Yoshimura, Seccaku, 1986, pp. 42-47, vol. 30, No. 7.
Alfred Hassner, "The Chemistry of Heterocyclic Compounds-Small Ring Heterocycles, Part 3 Oxiranes", An Interscience Publication 1985, John Wiley & Sons, 199 pgs.

(Continued)

*Primary Examiner* — Gerard Higgins
(74) *Attorney, Agent, or Firm* — Sughrue Mion, PLLC

(57) ABSTRACT

Provide is a curable composition for imprints capable of keeping a good pattern and heat resistance. A curable composition for imprints comprising a polymerizable compound (Ax-1) having maleimide structure(s), or a compound (Ax-2) having a partial structure represented by formula (I) below. Formula (I)

$$\left\{ \begin{array}{c} (Rx)_n \\ \vert \\ Si \\ \end{array} \right. \left( \phantom{x} \right)_m$$

18 Claims, No Drawings

(56) References Cited

OTHER PUBLICATIONS

International Search Report for PCT/JP2012/061167 dated Jul. 24, 2012.
Office Action dated Nov. 4, 2014, issued by the Japan Patent Office in corresponding Japanese Application No. 2011-099583.
Office Action dated Nov. 4, 2014, issued by the Japan Patent Office in corresponding Japanese Application No. 2011-184530.
English translation of the International Preliminary Report on Patentability mailed Nov. 7, 2013 for International Application No. PCT/JP2012/061167.
International Preliminary Report on Patentability mailed Nov. 7, 2013 for International Application No. PCT/JP2012/061167.
Office Action dated Mar. 14, 2016, issued by the Korean Intellectual Property Office in corresponding Korean Application No. 10-2013-7031316.

* cited by examiner

CURABLE COMPOSITION FOR IMPRINTS, PATTERN-FORMING METHOD AND PATTERN The present application is a continuation of PCT/JP2012/061167 filed on Apr. 26, 2012 and claims priority under 35 U.S.C. §119 of Japanese Patent Application Nos. 099583/2011 filed on Apr. 27, 2011 and 184530/2011 filed on Aug. 26, 2011.

TECHNICAL FIELD

The present invention relates to a curable composition for imprints. In further details, the present invention relates to a curable composition for imprints directed to fine patterning assisted by photo-irradiation, used for manufacturing various electronic devices, in particular, semiconductor integrated circuit, flat screen, micro electro-mechanical system (MEMS), sensor device, optical disk, magnetic recording media including high-density memory disk, optical components including grating and relief hologram, nanodevice, optical device, optical film and polarizing element used for manufacturing flat panel display, thin film transistor used for liquid crystal display, organic transistor, color filter, overcoat layer, pillar component, rib member for aligning liquid crystal, micro-lens array, immunoassay chip, DNA separation chip, micro-reactor, biological nanodevice, optical waveguide, optical filter, and photonic liquid crystal.

The present invention also relates to a curable composition and a novel compound, also usable for applications other than imprint.

BACKGROUND ART

Nanoimprint technology is a development advanced from embossing technology well known in the art of optical disc production, which comprises pressing a mold original with an embossed pattern formed on its surface (this is generally referred to as "mold", "stamper" or "template") against a resin to thereby accurately transfer the micropattern onto the resin through mechanical deformation of the resin. In this, when a mold is once prepared, then microstructures such as nanostructures can be repeatedly molded, and therefore, this is economical, and in addition, harmful wastes and discharges from this nanotechnology are reduced. Accordingly these days, this is expected to be applicable to various technical fields.

Two methods of nanoimprint technology have been proposed; one is a thermal nanoimprint method using a thermoplastic resin as the material to be worked (for example, non-patent literature 1), and the other is a photonanoimprint method using a photocurable composition (for example, non-patent literature 2). In the thermal nanoimprint method, a mold is pressed against a polymer resin heated up to a temperature not lower than the glass transition temperature thereof, then the resin is cooled and thereafter released from the mold to thereby transfer the microstructure of the mold onto the resin on a substrate. The method has been expected to be applied in various fields, by virtue of its applicability to a wide variety of resin materials and glass materials. For example, Patent Literatures 1 and 2 discloses nanoimprinting processes capable of forming nanopatterns using thermoplastic resins at low costs.

On the other hand, according to photo-nanoimprinting process by which a nano-photocurable composition for imprints is illuminated by light through a translucent mold or a translucent substrate, so as to cure a nano-photocurable composition for imprints, it is no longer necessary to heat the material onto which a pattern is transferred when stamped under a mold, and this enables imprint at room temperature. In recent years, reports have been also issued regarding new trends of development including nanocasting process which combines advantages of the both, and reversal imprinting process capable of forming a three-dimensional stacked structure.

Applications listed below have been proposed for the imprinting.

A first application relates to that a geometry (pattern) per se obtained by molding is functionalized so as to be used as a nano-technology component, or a structural member. Examples of which include a variety of micro- or nano-optical component, high-density recording medium, optical film, and structural member of flat panel display.

A second application relates to building-up of a laminated structure by using a mold capable of simultaneously forming a micro-structure and a nano-structure, or by simple alignment between layers, and use of the laminated structure for manufacturing β-TAS (Micro-Total Analysis System) or biochip.

A third application relates to use of the thus-formed pattern as a mask through which a substrate is worked typically by etching. By virtue of precise alignment and a large degree of integration, this technique can replace the conventional lithographic technique in manufacturing of high-density semiconductor integrated circuit, transistors in liquid crystal display device, and magnetic material for composing next-generation hard disk called patterned medium. Approaches for implementing the imprinting in these applications have been becoming more active in recent years.

As an exemplary application of the nanoimprinting process, first to be explained is an application to manufacture of high-density semiconductor integrated circuits. The semiconductor integrated circuits have been acceleratingly shrunk and integrated in these years, and for the purpose of implementing this sort of fine processing, photolithographic apparatuses used for pattern transfer have ceaselessly been improved in the preciseness. In order to address further requirements for shrinkage, it has however been becoming difficult to concurrently satisfy three requirements on resolution power of fine pattern, cost of apparatus, and throughput. In contrast, nanoimprint lithography (photo-nanoimprinting) has been proposed as a technique of forming fine patterns at low costs. For example, Patent Literature 1 and Patent Literature 3 listed below have disclosed nanoimprinting techniques using a silicon wafer as a stamper to form, by transfer, a fine structure of 25 nm or narrower. In this sort of application, a patternability as fine enough as several tens nanometers, and a high etching resistance enough to function as a mask during substrate working are required.

An exemplary application of the nanoimprint process to manufacture of the next-generation hard disk drive (HDD) will be explained. The HDD have achieved a large capacity by increasing the surface recording density. Increase in the recording density is, however, obstructed by so-called magnetic field spreading from the side faces of a magnetic head. Since the magnetic field spreading cannot be reduced beyond a certain value even if the head is shrunk, so that an event called side-writing may occur as a consequence. If the side-writing occurs, writing in the process of recording will extend to the adjacent track and will erase data already recorded therein. On the other hand, in the process of regeneration, an event such as reading of extra signal from the adjacent track may occur due to the spread magnetic field. In order to address these problems, there have been proposed techniques related to discrete track media and bit patterned media aimed at solving the problems by filling the inter-track gap with a non-magnetic material to thereby physically and magnetically isolate the tracks. Nanoimprinting has been also proposed to be applied to the formation of a magnetic or non-magnetic pattern in the manufacture of these media. Also in these applications, again a patternability as fine enough as several tens nanometers, and a high etching resistance enough to function as a mask during substrate working are required.

Next, applications of the nanoimprinting process to flat displays such as liquid crystal display (LCD) and plasma display (PDP) will be explained.

With recent trends in dimensional expansion and higher definition of LCD substrate and PDP substrate, photo-nanoimprinting has recently attracted public attention as an inexpensive lithographic technique substitutive to the conventional photolithography having been used for manufacturing thin film transistor (TFT) and electrode sheet. The situation has raised a need for development of a photo-curable resist substitutive for etching photoresists having been used for the conventional photolithographic process.

There is also an ongoing trend in application of photo-nanoimprinting process to manufacture of structural members of LCD and so forth, such as translucent protective films described in Patent Literature 4 and Patent Literature 5, and a spacer described in Patent Literature 5. The resist for configuring these structural members is occasionally referred to as "permanent resist" or "permanent film", since it finally remains in the display.

Spacers which determine the cell gap in the liquid crystal display are also a kind of the permanent film, for which photo-curable compositions composed of a resin, a photo-polymerizable monomer and an initiator have widely been used in the conventional photolithography (see Patent Literature 6, for example). The spacers are generally formed after a color filter or a color filter protecting film was formed over a color filter substrate, by coating a photo-curable composition, patterning it by photolithography into a pattern of 10 µm to 20 µm wide or around, and then curing it under heating by post-baking.

The nanoimprinting process may also be applied to formation of an anti-reflective structure generally called moth-eye. The anti-reflective structure having the refractive index varied in the thickness-wise direction thereof, may be formed by forming, on the surface of a translucent molding, an enormous number of fine irregularities composed of a translucent material with a pitch not larger than the wavelength of light. This sort of anti-reflective structure has the refractive index continuously varies in the thickness-wise direction thereof without producing boundaries of the refractive index, and may be given as theoretically non-reflective. The structure are superior in the anti-reflective performance over multi-layered, anti-reflective films, by virtue of its small wavelength dependence, and high anti-reflective performance against an obliquely incident light.

The nanoimprinting lithography is also useful for applications regarding formation of permanent films, which include micro electro-mechanical system (MEMS), sensor device, optical components including grating and relief hologram, nanodevice, optical device, optical film and polarizing element used for manufacturing flat panel display, thin film transistor used for liquid crystal display device, organic transistor, color filter, overcoat layer, pillar component, rib member for aligning liquid crystal, micro-lens array, immunoassay chip, DNA separation chip, microreactor, biological nanodevice, optical waveguide, optical filter, and photonic liquid crystal.

In these applications regarding the permanent films, the thus-formed permanent films finally remain in the products, and are therefore required to be excellent mainly regarding durability and strength of the film, including heat resistance, light resistance, solvent resistance, scratch resistance, high mechanical performance under externally applied pressure, and hardness.

As described above, most of the patterns having been formed by the conventional photolithographic process may be formed by nanoimprinting, which has attracted public attention for its possibility of forming fine patterns at low costs, as known by Patent Literatures 7 to 9, for example.

The nanoimprinting is required to ensure a good patternability when intended for industrial use, and is further required for good durability (heat resistance, weatherability, for example) when intended for use of the obtained pattern. While some of the curable composition for imprints having been used conventionally are known to exhibit a patternability of 100 nm or finer, none have been known to additionally satisfy heat resistance (250° C. or above for example, and further 300° C. or above), and in particular heat resistance in the air.

CITATION LIST

Patent Literature

[Patent Literature 1] U.S. Pat. No. 5,772,905
[Patent Literature 2] U.S. Pat. No. 5,956,216
[Patent Literature 3] U.S. Pat. No. 5,259,926
[Patent Literature 4] JP-A-2005-197699
[Patent Literature 5] JP-A-2005-301289
[Patent Literature 6] JP-A-2004-240241
[Patent Literature 7] JP-A-2008-168480
[Patent Literature 8] JP-A-2010-67621
[Patent Literature 9] JP-A-2006-310565

Non-Patent Literature

[Non-Patent Literature 1] S. Chou et al., *Appl. Phys. Lett.*, Vol. 67, 3114 (1995)
[Non-Patent Literature 2] M. Colbun et al., *Proc. SPIE*, Vol. 3676, 379 (1999)

SUMMARY OF THE INVENTION

Technical Problem

It is therefore an object of the present invention to solve the problems described above, and is to provide a curable composition for imprints capable of keeping a good pattern even if heated at high temperatures in the air.

Solution to Problem

Under the circumstances, the present inventors made thorough investigations, the problem was solved by a means <1> described below, and more preferably by means <2> to <34>.

<1> A curable composition for imprints comprising a polymerizable compound (Ax-1) having maleimide structure(s).

<2> The curable composition for imprints of <1>, wherein the polymerizable compound (Ax-1) having maleimide structure(s) is a compound having two or more maleimide structures, or, a compound having a maleimide group and a polymerizable group other than maleimide group and being free from ester group.

<3> The curable composition for imprints of <1> or <2>, wherein the polymerizable compound (Ax-1) has silicon atom(s).

<4> The curable composition for imprints of <1> or <2>, wherein the polymerizable compound (Ax-1) has silicon atom(s), and the silicon atom(s) are contained in a chain-like structure of the polymerizable compound (Ax-1).

<5> The curable composition for imprints of any one of <1> to <4>, wherein the polymerizable compound (Ax-1) is free from ester group in the molecule thereof.

<6> The curable composition for imprints of any one of <1> to <5>, wherein the polymerizable compound (Ax-1) has a structure in which a silicon atom is bond to an oxygen atom.

<7> The curable composition for imprints of any one of <1> to <6>, wherein the polymerizable compound (Ax-1) has no hetero atom other than a hetero atom contained in the maleimide group, and other than the oxygen atom bond to the silicon atom.

<8> The curable composition for imprints of any one of <1> to <7>, wherein the polymerizable compound (Ax-1) has a molecular weight of 200 to 500.

<9> The curable composition for imprints of any one of <1> to <8>, further comprising a photo-polymerization initiator (B).

<10> The curable composition for imprints of any one of <1> to <9>, wherein the polymerizable group is a vinyl group bond to the silicon atom.

<11> The curable composition for imprints of any one of <1> to <10>, wherein the polymerizable compound (Ax-1) is represented by formula (Ax-15):

[Chemical Formula 1]

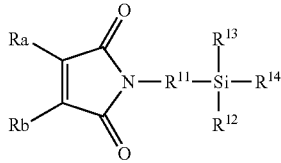

Formula (Ax-15)

(in the formula (Ax-15), each of Ra and Rb independently represents a hydrogen atom or alkyl group, $R^{11}$ represents a linking group being free from hetero atom, and each of $R^{12}$ to $R^{14}$ independently represents an alkyl group, aryl group, vinyl group, or a group represented by —O—Si($R^{15}$)($R^{16}$)($R^{17}$). Each of $R^{15}$ to $R^{17}$ independently represents an alkyl group, aryl group or vinyl group.)<

<12> The curable composition for imprints of any one of <1> to <10>, wherein the polymerizable compound (Ax-1) is represented by formula (Ax-16):

[Chemical Formula 2]

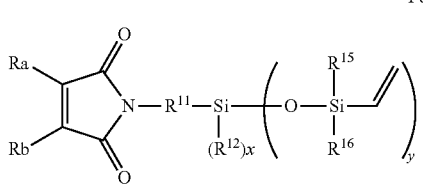

Formula (Ax-16)

(in the formula (Ax-16), each of Ra and Rb independently represents a hydrogen atom or alkyl group, $R^{11}$ represents a linking group being free from hetero atom, and $R^{12}$ represents an alkyl group, aryl group, vinyl group, or a group represented by —O—Si($R^{15}$)($R^{16}$)($R^{17}$). Each of $R^{15}$ to $R^{17}$ independently represents an alkyl group, aryl group or vinyl group. x represents an integer of 0 to 2, and y represents an integer of 1 to 3, where x+y=3.)

<13> A curable composition for imprints comprising a compound (Ax-2) having a partial structure represented by formula (I) below, and, a photo-polymerization initiator (B):

[Chemical Formula 3]

Formula (I)

(in the formula (I), Rx represents an alkyl group or aryl group. m represents an integer of 1 to 3, and n represents an integer of 0 to 2, where m+n=3.)

<14> The curable composition for imprints of <13>, wherein $R_x$ represents a methyl group.

<15> The curable composition for imprints of <13> or 14, wherein the compound (Ax-2) has a partial structure represented by formula (II) below:

[Chemical Formula 4]

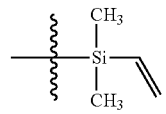

Formula (II)

<16> The curable composition for imprints of any one of <13> to <15>, wherein the compound (Ax-2) contains two or more silicon atoms.

<17> The curable composition for imprints of any one of <13> to <16>, wherein the compound (Ax-2) contains a partial structure represented by silicon atom-oxygen atom-silicon atom.

<18> The curable composition for imprints of any one of <13> to <17>, wherein the compound (Ax-2) contains a (meth)acryloyloxy group.

<19> The curable composition for imprints of any one of <13> to <18>, wherein the compound (Ax-2) has two or more partial structures represented by the formula (I).

<20> The curable composition for imprints of any one of <13> to <19>, wherein the compound (Ax-2) is a compound represented by formula (III) or formula (IV):

Formula (III)

(meth)acryloyloxy group-alkylene group-
    Si—(R)$_3$    [Chemical Formula 5]

(in the formula (III), each R independently represents a methyl group or —O—Si(CH$_3$)$_2$—CH═CH$_2$, and at least one of (R)s represents —O—Si(CH$_3$)$_2$—CH═CH$_2$.);

[Chemical Formula 6]

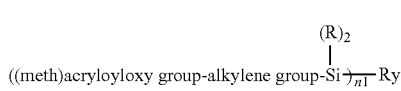

Formula (IV)

(in the formula (IV), each R independently represents a methyl group or —O—Si(CH$_3$)$_2$—CH=CH$_2$, and at least one of (R)s represents —O—Si(CH$_3$)$_2$—CH=CH$_2$. Ry represents an n1-valent linking group. n1 represents an integer of 2 to 6.)

<21> The curable composition for imprints of any one of <13> to <20>, further comprising a polymerizable compound different from the compound (Ax-2).

<22> The curable composition for imprints of <21>, wherein the polymerizable compound different from the compound (Ax-2) is a (meth)acrylate.

<23> The curable composition for imprints of any one of <13> to <22>, wherein the compound (Ax-2) accounts for 30 to 99% by mass of the total components excluding solvent.

<24> A pattern-forming method using the curable composition for imprints described in any one of <1> to <23>.

<25> A pattern-forming method comprising:

applying the curable composition for imprints described in any one of <1> to <23> onto a substrate, to thereby form a pattern-forming layer;

pressing a mold onto the surface of the pattern-forming layer; and irradiating light onto the pattern-forming layer.

<26> A pattern obtained by the pattern-forming method described in <24> or <25>.

<27> An electronic device comprising the pattern described in <26>.

<28> A method of manufacturing an electronic device comprising the pattern-forming method described in <24> or <25>.

<29> A curable composition comprising a polymerizable compound represented by formula (Ax-15):

Formula (Ax-15)

[Chemical Formula 7]

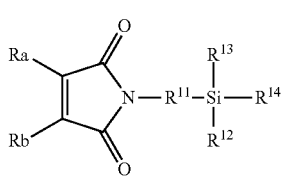

(in the formula (Ax-15), each of Ra and Rb independently represents a hydrogen atom or alkyl group, R$^{11}$ represents a linking group being free from hetero atom, and each of R$^{12}$ to R$^{14}$ independently represents an alkyl group, aryl group, vinyl group, or a group represented by —O—Si(R$^{15}$)(R$^{16}$)(R$^{17}$) Each of R$^{15}$ to R$^{17}$ independently represents an alkyl group, aryl group or vinyl group.)

<30> A curable composition comprising a polymerizable compound represented by formula (Ax-16):

Formula (Ax-16)

[Chemical Formula 8]

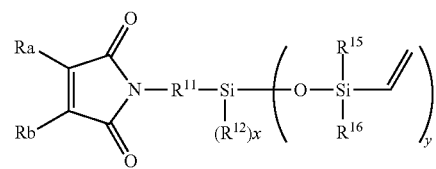

(in the formula (Ax-16), each of Ra and Rb independently represents a hydrogen atom or alkyl group, R$^{11}$ represents a linking group being free from hetero atom, and R$^{12}$ represents an alkyl group, aryl group, vinyl group, or a group represented by —O—Si(R$^{15}$)(R$^{16}$)(R$^{17}$) Each of R$^{15}$ to R$^{17}$ independently represents an alkyl group, aryl group or vinyl group. x is an integer of 0 to 2, and y is an integer of 1 to 3, where x+y=3.)

<31> A polymerizable compound represented by formula (Ax-15):

Formula (Ax-15)

[Chemical Formula 9]

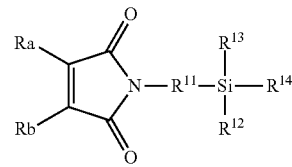

(in the formula (Ax-15), each of Ra and Rb independently represents a hydrogen atom or alkyl group, R$^{11}$ represents a linking group being free from hetero atom, and each of R$^{12}$ to R$^{14}$ independently represents an alkyl group, aryl group, vinyl group, or a group represented by —O—Si(R$^{15}$)(R$^{16}$)(R$^{17}$). Each of R$^{15}$ to R$^{17}$ independently represents an alkyl group, aryl group or vinyl group.)

<32> A polymerizable compound represented by formula (Ax-16)

Formula (Ax-16)

[Chemical Formula 10]

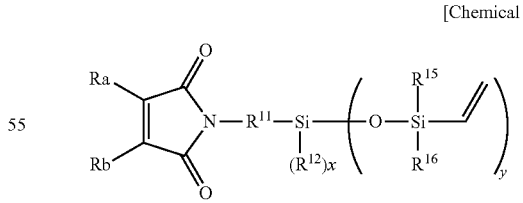

(in the formula (Ax-16), each of Ra and Rb independently represents a hydrogen atom or alkyl group, R$^{11}$ represents a linking group being free from hetero atom, and R$^{12}$ represents an alkyl group, aryl group, vinyl group, or a group represented by —O—Si(R$^{15}$)(R$^{16}$)(R$^{17}$). Each of R$^{15}$ to R$^{17}$ independently represents an alkyl group, aryl group or vinyl group. x represents an integer of 0 to 2, and y represents an integer of 1 to 3, where x+y=3.)

<33> A curable composition comprising a compound having 2 to 6 (meth)acryloyloxy groups represented by formula (IV) below:

Formula (IV)

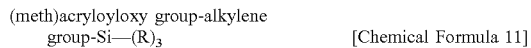  [Chemical Formula 11]

(in the formula (IV), each R independently represents a methyl group or —O—Si(CH$_3$)$_2$—CH=CH$_2$, at least one of (R)s represents —O—Si(CH$_3$)$_2$—CH=CH$_2$. Ry represents an n1-valent linking group. n1 represents 2 to 6.)

<34> A compound having 2 to 6 (meth)acryloyloxy groups represented by formula (IV) below:

Formula (IV)

[Chemical Formula 12]

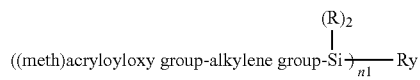

(in the formula (IV), each R independently represents a methyl group or —O—Si(CH$_3$)$_2$—CH=CH$_2$, and at least one of (R)s represents —O—Si(CH$_3$)$_2$—CH=CH$_2$. Ry represents an n1-valent linking group. n1 represents 2 to 6.)

Advantageous Effects of Invention

By using the composition of the present invention as a curable composition for imprints, it is now possible to provide a curable composition for imprints capable of keeping a good pattern even if heated at high temperatures in the air.

DESCRIPTION OF EMBODIMENTS

The contents of the invention are described in detail hereinunder. In this description, the numerical range expressed by the wording "a number to another number" means the range that falls between the former number indicating the lowermost limit of the range and the latter number indicating the uppermost limit thereof.

In this description, "(meth)acrylate" means acrylate and methacrylate; "(meth)acrylic" means acrylic and methacrylic; "(meth)acryloyl" means acryloyl and methacryloyl. The monomer in the context of the present invention is discriminated from oligomer and polymer, and is defined as any compound having a weight average molecular weight of 2,000 or smaller.

"Imprint" referred to in the invention is meant to indicate pattern transfer in a size of from 1 nm to 10 mm and preferably meant to indicate pattern transfer in a size of from about 10 nm to 100 μm (nanoimprint).

Regarding the expression of "group (atomic group)" in this description, the expression with no indication of "substituted" or "unsubstituted" includes both "substituted group" and "unsubstituted group". For example, "alkyl group" includes not only an alkyl group not having a substituent (unsubstituted alkyl group) but also an alkyl group having a substituent (substituted alkyl group).

[Curable Composition for Imprints of the Present Invention]

A first embodiment of the curable composition for imprints of the present invention contains a polymerizable compound (Ax-1) having maleimide structure(s). While maleimide compounds are photo-curable without polymerization initiator, the curable composition preferably contains a photo-polymerization initiator (B). Besides this, other component may be added arbitrarily, for the purpose of imprinting various characteristics.

Polymerizable Compound (Ax-1) Having Maleimide Structure(s)

While any types of polymerizable compound (Ax-1) having maleimide structure(s) will suffice if they have the maleimide structure, preferably used are multi-valent polymerizable compounds having two or more polymerizable groups, and more preferably used are compounds having two or more maleimide structures, or, compounds having a maleimide group and a polymerizable group other than maleimide group and being free from ester group. By virtue of this structure, patterns formed by imprinting will have an improved heat resistance. For the case where the polymerizable compound has two or more maleimide structures, the number of maleimide groups is preferably 2 to 4 in view of suppressing crystallization, more preferably 2 or 3, and furthermore preferably 2.

The polymerizable group other than maleimide group and being free from ester group means that the compound does not have a structure such as (meth)acrylate having a carbon-carbon multiple bond bound to an ester group. The polymerizable group other than maleimide group may be either a polymerizable group polymerizable with maleimide group, or a polymerizable group not polymerizable with maleimide group, where the polymerizable group polymerizable with maleimide group is preferable. The polymerizable group other than maleimide group is preferably any of those having a carbon-carbon multiple bond not bound to an ester group (for example, vinyl group, allyl group, cyclohexenyl group, vinyl ether group, and styIyl group), epoxy group and oxetanyl group, wherein the carbon-carbon multiple bond not bound to an ester group is more preferable.

In view of improving the heat resistance of the pattern, the polymerizable compound (Ax-1) used in the present invention preferably is free from ester group in the molecule thereof.

From the viewpoint of further improving the heat resistance, the polymerizable compound (Ax-1) preferably has a silicon atom. From the viewpoint of suppressing crystallization, the silicon atom is preferably contained in a straight or branched chain-like structure. The chain-like structure herein is an antonym of cyclic structure, and "silicon atom is contained in a chain-like structure" means that the silicon atom is not a constitutive atom composing any cyclic structure. In the present invention, silicon atom is preferably not contained even in a substituent on the cyclic structure.

The polymerizable compound (Ax-1) preferably has 1 to 20 silicon atoms, more preferably has 2 to 15 silicon atoms, and furthermore preferably has 2 to 12 silicon atoms. From the viewpoint of improving the heat resistance of the pattern, the polymerizable compound (Ax-1) preferably has a structure in which a silicon atom is bound to an oxygen atom, and more preferably has a Si—O—Si bond.

The polymerizable compound (Ax-1) also preferably is free from Si—O—C bond, from the viewpoint of long-term stability. The polymerizable compound (Ax-1) is again preferably contains no additional hetero atom besides a hetero atom contained in the maleimide group, and besides the oxygen atom bound to the silicon atom.

The polymerizable compound (Ax) preferably is free from halogen atom, from the viewpoints of the heat resistance, and a risk of producing a corrosive gas under heating which could corrode the apparatuses.

The polymerizable compound (Ax-1) used in the present invention is preferably composed of maleimide group, hydrogen atom, carbon atom, oxygen atom and silicon atom only.

The polymerizable compound (Ax-1) preferably has a molecular weight of 100 to 2,000, more preferably 150 to 700, and furthermore preferably 200 to 500. By controlling the molecular weight in the appropriate ranges, the polymerizable compound (Ax-1) may be suppressed from vaporizing while keeping the viscosity at a low level, and thereby the patternability may be improved.

From the viewpoint of compatibility with other component, and suppression of failure in coating, the polymerizable compound (Ax-1) having maleimide structure (s) preferably has a melting point of 100° C. or below, more preferably 50° C. or below, and furthermore preferably exists in a liquid form at 25° C.

The polymerizable compound (Ax-1) is preferably a compound represented by the formula (Ax-11) or (Ax-12) below:

Formula (Ax-11)

[Chemical Formula 13]

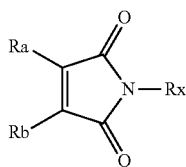

(in the formula (Ax-11), each of Ra and Rb independently represents a hydrogen atom or alkyl group, and Rx represents an alkyl group, aryl group or aralkyl group, which may have a linking group having a hetero atom in the chain thereof. The alkyl group, aryl group and aralkyl group may have a substituent.)

Each of Ra and Rb independently and preferably represents a hydrogen atom or $C_{1-3}$ alkyl group, and more preferably a hydrogen atom or methyl group.

Rx may have, as a substituent, a polymerizable group other than maleimide group, and preferably has thereon, a polymerizable group other than maleimide group. The polymerizable group, if exists, is preferably a vinyl group.

The alkyl group represented by Rx is preferably a $C_{1-10}$ straight-chain or branched alkyl group, and more preferably an unsubstituted $C_{1-10}$ straight-chain or branched alkyl group.

The linking group which contains a hetero atom is exemplified by —O— or —CO—, and groups composed of combinations of them.

The aryl group represented by Rx is preferably a phenyl group. The aryl group preferably has a substituent on the aromatic ring thereof. The substituent is preferably an alkyl group, alkenyl group or alkynyl group, wherein alkyl group is preferable. These substituents preferably have 1 to 10 carbon atoms.

The aralkyl group represented by Rx is preferably an aryl group having a substituent on the aromatic ring thereof. The aromatic ring is preferably a benzene ring. The aralkyl group preferably has 7 to 20 carbon atoms.

Rx preferably has an alkyl group having 3 or more carbon atoms, or an alkylene group having 3 or more carbon atoms, from the viewpoint of allowing the polymerizable compound (Ax-1) to exist in a liquid form at 25° C.

Formula (Ax-12)

[Chemical Formula 14]

(In the formula (Ax-12), each of Ra and Rb independently represents a hydrogen atom or alkyl group, and Ry represents an alkylene group or arylene group, or groups configured by combining them, and the two may be linked via a linking group having a hetero atom. The alkyl group and the arylene group may have a substituent.)

Each of Ra and Rb independently and preferably represents a hydrogen atom or $C_{1-3}$ alkyl group, and more preferably represents a hydrogen atom or methyl group.

Ry may contain a polymerizable group other than maleimide group. The polymerizable group, if exists, is preferably a vinyl group.

The alkylene group represented by Ry is preferably a $C_{1-300}$ alkylene group.

The linking group having a hetero atom is exemplified by —O— or —CO—, and groups composed of combinations of them.

The arylene group represented by Ry is preferably a phenylene group.

Ry preferably has an alkyl group having 3 or more carbon atoms, or an alkylene group having 3 or more carbon atoms, from the viewpoint of allowing the polymerizable compound (Ax-1) to exist in a liquid form.

Specific examples of the compounds represented by the formula (Ax-11) or (Ax-12) will be listed below.

Ra and Rb are synonymous to those described above, and preferably represent a hydrogen atom. In the formulae below, n1 is preferably 2 to 10, n2 is preferably 1 to 10, n3 is preferably 6 to 20, and n4 is preferably 1 to 10.

[Chemical Formula 15]

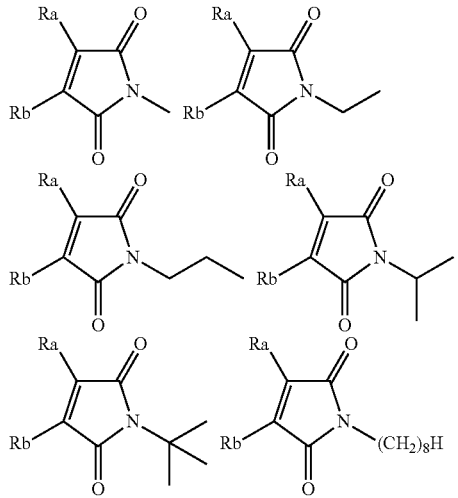

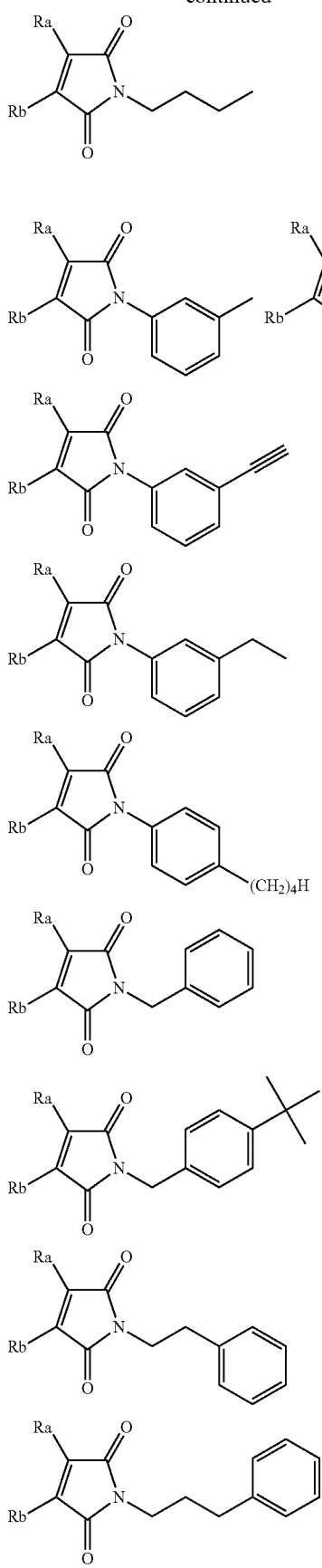
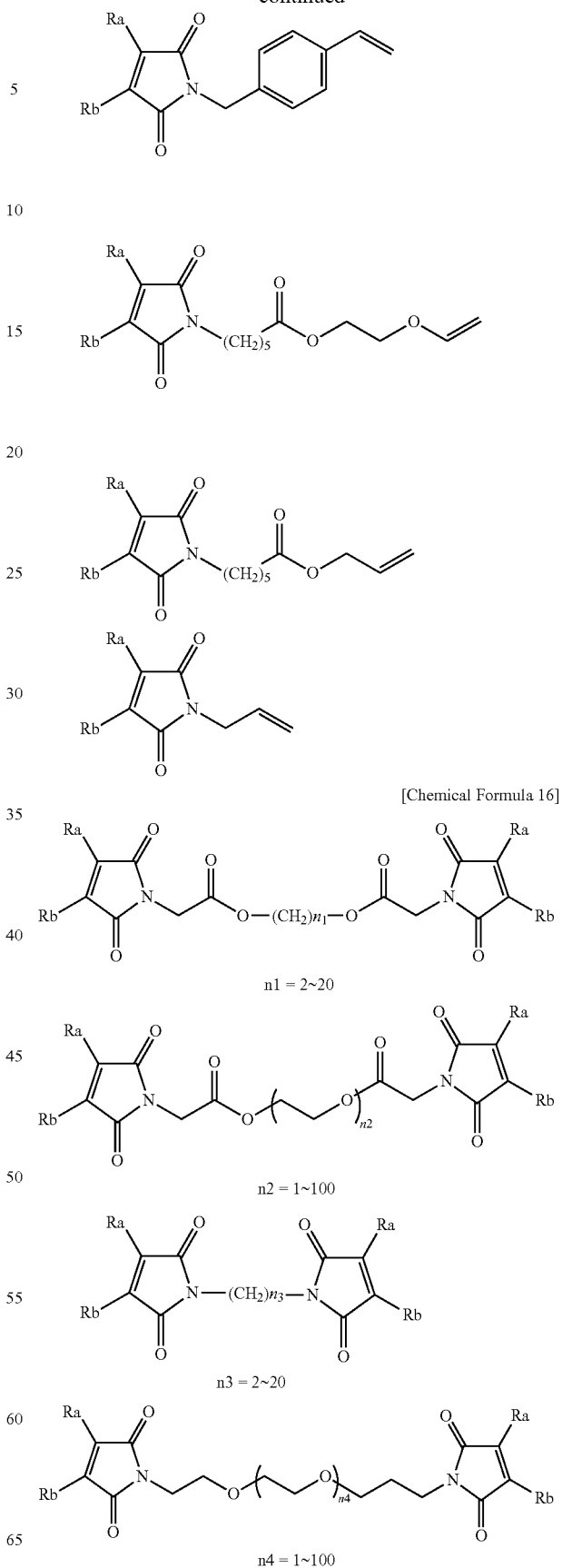

-continued

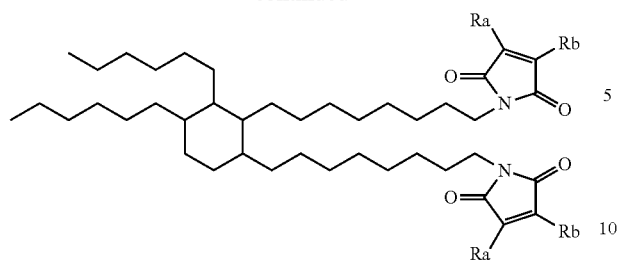
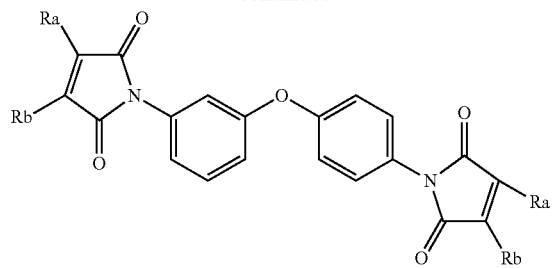

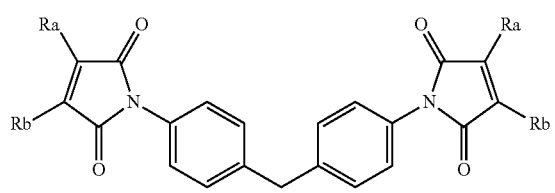
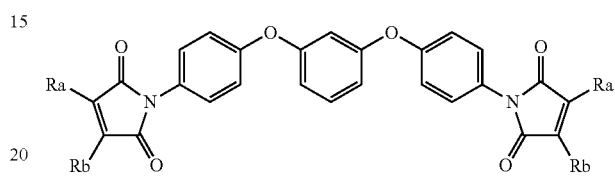

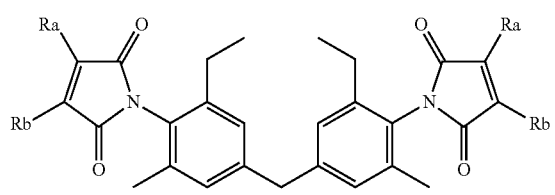

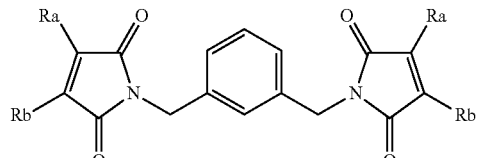

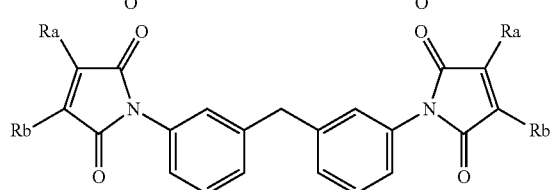

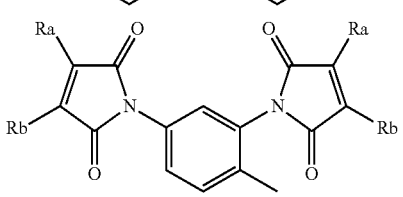

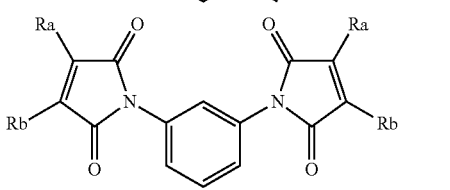

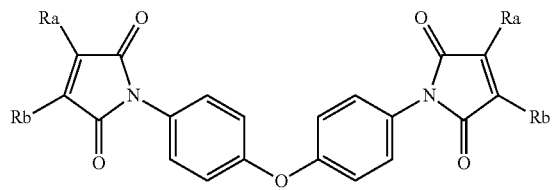

Other preferable examples of the polymerizable compound (Ax-1) are exemplified by compounds which contain silicon atom(s). The compounds which contain silicon atom(s) are preferably those represented by formula (Ax-13) below, and more preferably those represented by formula (Ax-14) below:

Formula (Ax-13)

[Chemical Formula 17]

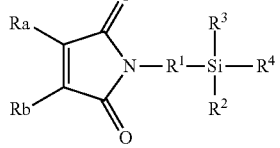

(in the formula (Ax-13), each of Ra and Rb independently represents a hydrogen atom or alkyl group, $R^1$ represents a linking group, and each of $R^2$ to $R^4$ independently represents a hydrogen atom or substituent.)

Each of Ra and Rb independently, and preferably represents a hydrogen atom or $C_{1-3}$ alkyl group, and more preferably, and independently represents a hydrogen atom or methyl group.

$R^1$ preferably represents an alkylene group, and more preferably a $C_{1-4}$ alkylene group.

Each of $R^2$ to $R^4$ independently, and preferably represents a hydrogen atom, alkyl group, aryl group, residue containing a maleimide group, or group having a polymerizable group other than maleimide group and being free from ester group, and more preferably, at least one of them is a residue containing a maleimide group, or a polymerizable group other than maleimide group and being free from ester group, wherein the residual is an hydrogen atom or substituent. The substituent in this case is exemplified by an alkyl group or aryl group. The polymerizable group other than maleimide group and being free from ester group, is synonymous to that described above, with the same preferable ranges.

Each of $R^2$ to $R^4$ independently, and preferably has 1 to 8 carbon atoms, and more preferably has 1 to 6 carbon atoms.

At least one of $R^2$ to $R^4$ preferably represents a vinyl group.

Formula (Ax-14)

[Chemical Formula 18]

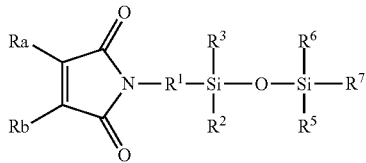

(In the formula (Ax-14), each of Ra and Rb independently represents a hydrogen atom or alkyl group, $R^1$ represents a linking group, and each of $R^2$ to $R^7$ independently represents a hydrogen atom or substituent.)

$R^1$ preferably represents an alkylene group, and more preferably represents a $C_{1-4}$ alkylene group.

Each of $R^2$ to $R^7$ independently, and preferably represents a hydrogen atom, alkyl group, aryl group, residue containing a maleimide group, or a polymerizable group other than maleimide group and being free from ester group, more preferably at least one of them is a residue containing maleimide group, or a polymerizable group other than maleimide group and being free from ester group, and the residual is a hydrogen atom or substituent. The substituent in this case is exemplified by an alkyl group or aryl group. The polymerizable group other than maleimide group and being free from ester group, is synonymous to that described above, with the same preferable ranges.

Each of $R^2$ to $R^7$ independently, and preferably has 1 to 8 carbon atoms, and more preferably has 1 to 6 carbon atoms.

At least one of $R^2$ to $R^7$ preferably represents a vinyl group.

The polymerizable compound (Ax-1) is more preferably a compound represented by formula (Ax-15) below, and particularly a compound represented by formula (Ax-16) below:

Formula (Ax-15)

[Chemical Formula 19]

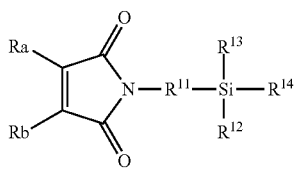

(in the formula (Ax-15), each of Ra and Rb independently represents a hydrogen atom or alkyl group, $R^{11}$ represents a linking group being free from hetero atom, and each of $R^{12}$ to $R^{14}$ independently represents an alkyl group, aryl group, vinyl group, or a group represented by $—O—Si(R^{15})(R^{16})(R^{17})$. Each of $R^{15}$ to $R^{17}$ independently represents an alkyl group, aryl group or vinyl group.)

$R^{11}$ preferably represents an alkylene group or arylene group, and more preferably a $C_{1-5}$ alkylene group or phenylene group.

The alkyl group represented by $R^{12}$ to $R^{14}$ is preferably $C_{1-3}$ alkyl group, and more preferably a methyl group.

The aryl group represented by $R^{12}$ to $R^{14}$ is preferably a phenyl group.

The alkyl group represented by $R^{15}$, $R^{16}$ and $R^{17}$ is preferably a $C_{1-3}$ alkyl group, and more preferably a methyl group.

The aryl group represented by $R^{15}$, $R^{16}$ and $R^{17}$ is preferably a phenyl group.

Formula (Ax-16)

[Chemical Formula 20]

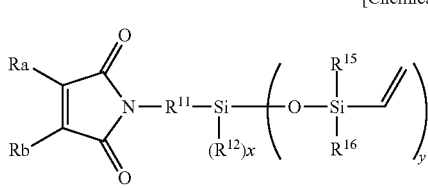

(In the formula (Ax-16), each of Ra and Rb independently represents a hydrogen atom or alkyl group, $R^{11}$ represents a linking group being free from hetero atom, and $R^{12}$ represents an alkyl group, aryl group, vinyl group, or a group represented by $—O—Si(R^{15})(R^{16})(R^{17})$. Each of $R^{15}$ to $R^{17}$ independently represents an alkyl group, aryl group or vinyl group. x is an integer of 0 to 2, and y is an integer of 1 to 3, where x+y=3.)

$R^{11}$ preferably represents an alkylene group or arylene group, and more preferably represents a $C_{1-5}$ alkylene group or phenylene group.

The alkyl group represented by $R^{12}$ is i preferably a $C_{1-3}$ alkyl group, and more preferably a methyl group.

The aryl group represented by $R^{12}$ is preferably a phenyl group.

The alkyl group represented by $R^{15}$, $R^{16}$ and $R^{17}$ is preferably a $C_{1-3}$ alkyl group, and more preferably a methyl group.

The aryl group represented by $R^{15}$, $R^{16}$ and $R^{17}$ is preferably a phenyl group.

Specific examples of the compounds represented by the formulae (Ax-13) to (Ax-16) will be listed below.

Ra and Rb are synonymous to those described above, and each of which is preferably a hydrogen atom.

[Chemical Formula 21]

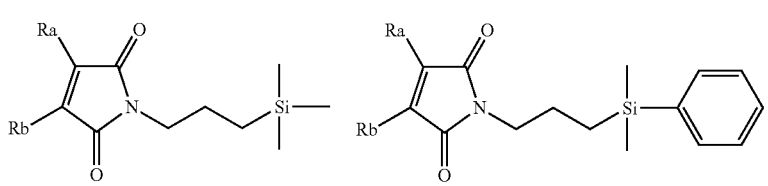

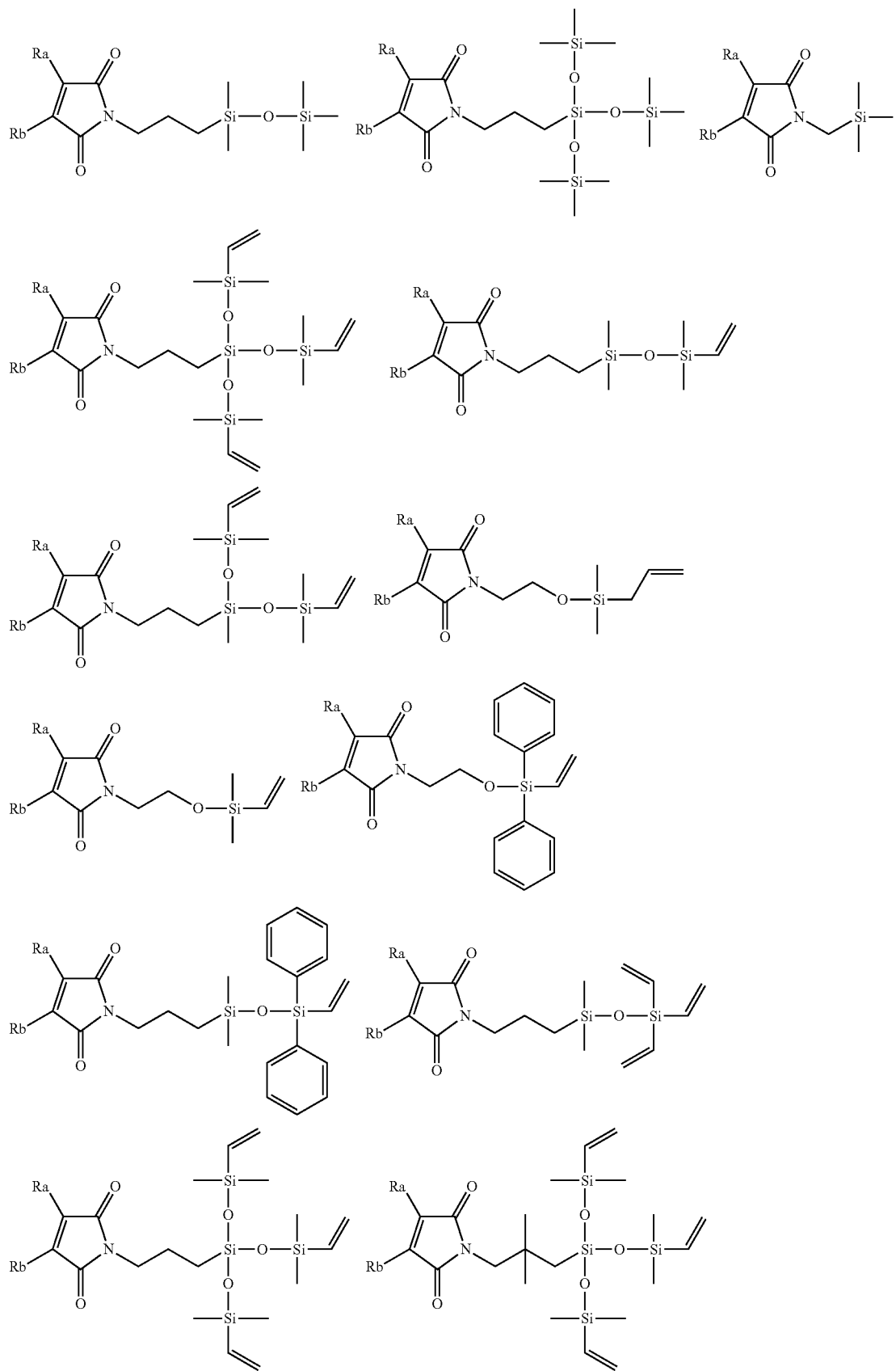

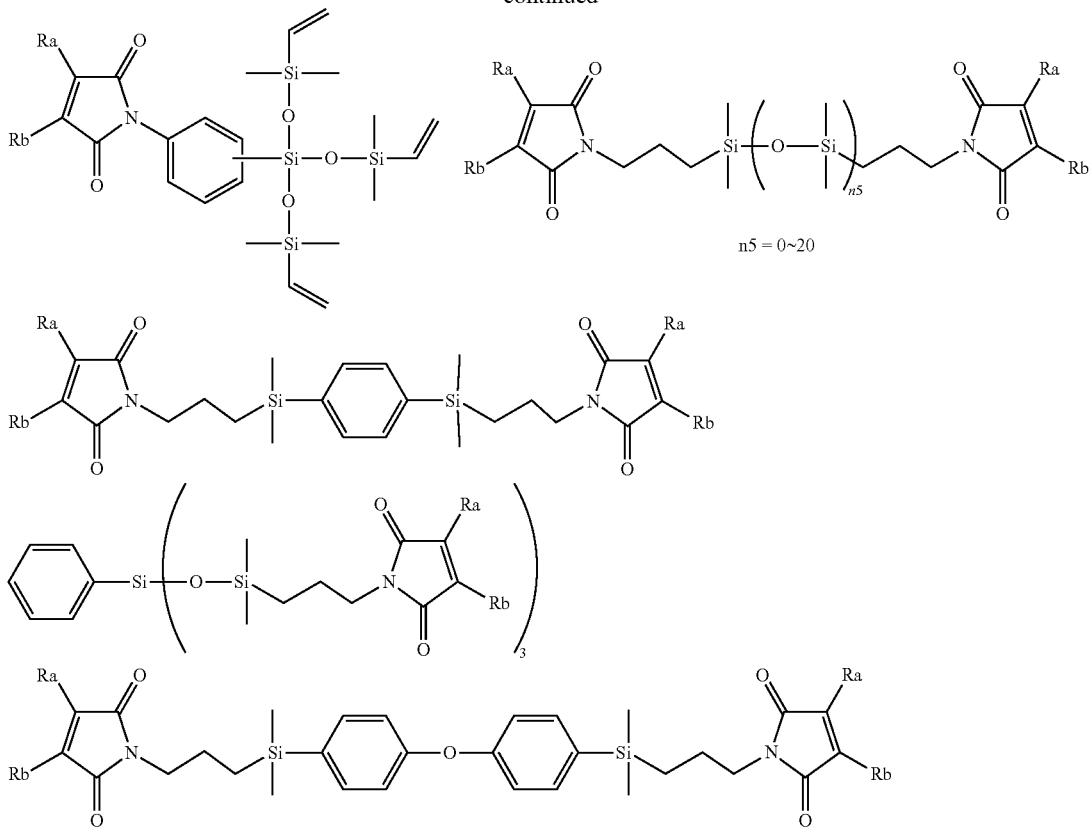

The polymerizable compound (Ax-1) used in the present invention may be synthesized by any of publicly-known methods. For example, according to SCHEME 1, a possible method is such as allowing maleic anhydride to react with an amine compound to thereby form the maleimide structure. According to SCHEME 2, another possible method is such as allowing allyl maleimide to react with a silane compound to synthesize the maleimide compound having a silicon atom.

[Chemical Formula 22]

(SCHEME1)

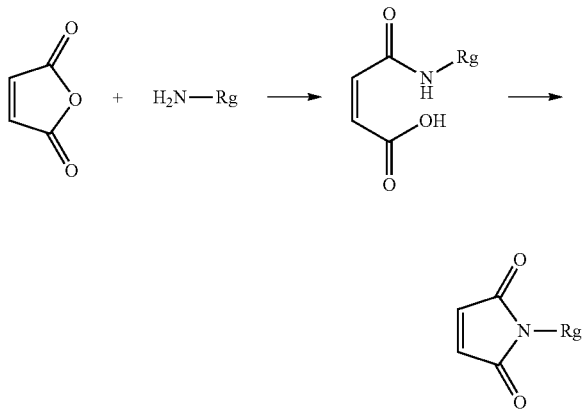

-continued
(SCHEME2)

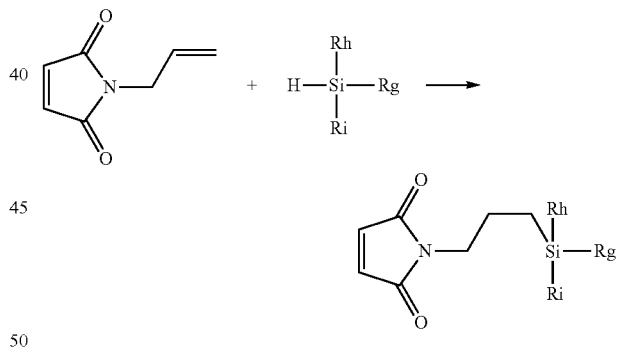

Content of the polymerizable compound (Ax-1) in the composition of the present invention preferably accounts for 30 to 100% by mass of the total components excluding solvent, more preferably 50 to 99% by mass, and furthermore preferably 70 to 98% by mass. Content of the polymerizable compound (Ax-1) in the total polymerizable compounds preferably accounts for 40 to 100% by mass, more preferably 60 to 100% by mass, and furthermore preferably 80 to 100% by mass. When the composition contains other polymerizable compound, the compound preferably has a partial structure represented by formula (A1) shown later, wherein the total content of the polymerizable compound (Ax-1) and the compound having a partial structure represented by the formula (A1) shown later preferably accounts for 80% by mass or more of the total polymerizable compounds, more preferably 90% by mass or more, and furthermore preferably 98% by mass or more.

Other Polymerizable Compound (A-1)

The curable composition of the present invention may contain a polymerizable compound (A-1), besides the polymerizable compound (Ax-1).

The other polymerizable compound (A-1) is preferably a compound capable of polymerizing with the polymerizable compound (Ax-1), and is more specifically a compound having a polymerizable group capable of polymerizing with the maleimide group contained in the polymerizable compound (Ax-1) or with other polymerizable group. The polymerizable group owned by the other polymerizable compound (A-1) is preferably a radical polymerizable group, preferably a compound having a carbon-carbon multiple bond not bound to an ester group (for example, vinyl group, allyl group, cyclohexenyl group, vinyl ether group, stylyl group, or ethynyl group) or (meth)acrylate group, and more preferably a compound having a vinyl group, vinyl ether group or (meth)acrylate group.

The polymerizable compound (A-1) preferably has 1 to 6 polymerizable groups, and more preferably has 2 to 4 polymerizable groups. The molecule may have 2 or more species of polymerizable groups.

From the viewpoint of improving the heat resistance of the pattern, the other polymerizable compound (A-1) preferably has a silicon atom.

The other polymerizable compound (A-1) is preferably a compound having a partial structure represented by the formula (A1) below:

Formula (A1)

[Chemical Formula 23]

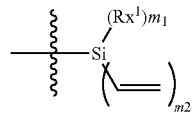

(in the formula (A1), $Rx^1$ represents an alkyl group or aryl group. m1 represents an integer of 0 to 2, and m2 represents an integer of 1 to 3, where m+n=3. If m1 is 2 or larger, $(Rx^1)$s may be same or different from each other.)

The alkyl group represented by $Rx^1$ is preferably a $C_{1-4}$ alkyl group, and more preferably a methyl group.

The aryl group represented by Rx is preferably a phenyl group or naphthyl group, and a phenyl group is more preferable. While the aryl group may have thereon a substituent, it is better to have no substituent.

$m^1$ represents an integer of 0 to 2, and is preferably 2. m2 represents an integer of 1 to 3, and is preferably 1.

The partial structure represented by the formula (A1) is bound to other substituent at the wavy line. It is preferable that the partial structure do not have halogen atom, alkoxy group, acyloxy group and hydroxy group as the substituent on the silicon atom, from the viewpoint of long-term stability. The silicon atom is thus specified, for the purpose of excluding, for example, silane coupling agent.

The compound having a partial structure represented by the formula (A1) is exemplified by those listed below.

[Chemical Formula 24]

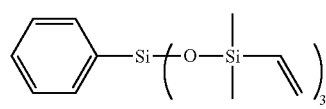

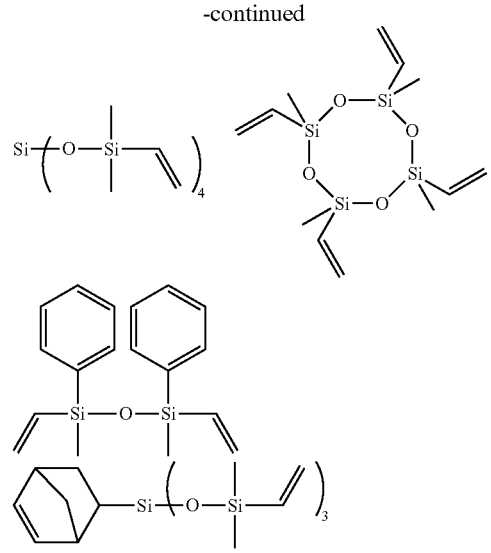

The compound having the partial structure represented by the formula (A1) and the other polymerizable group is exemplified by those listed below. Rc in the formula represents a hydrogen atom or methyl group.

[Chemical Formula 25]

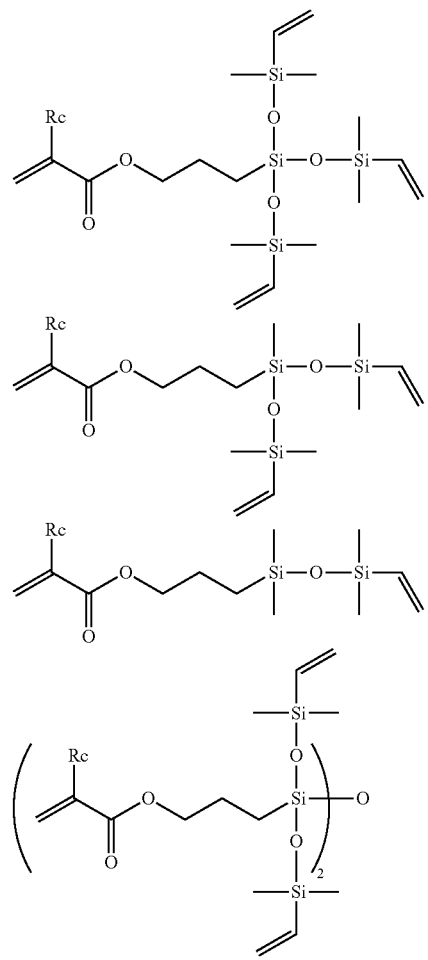

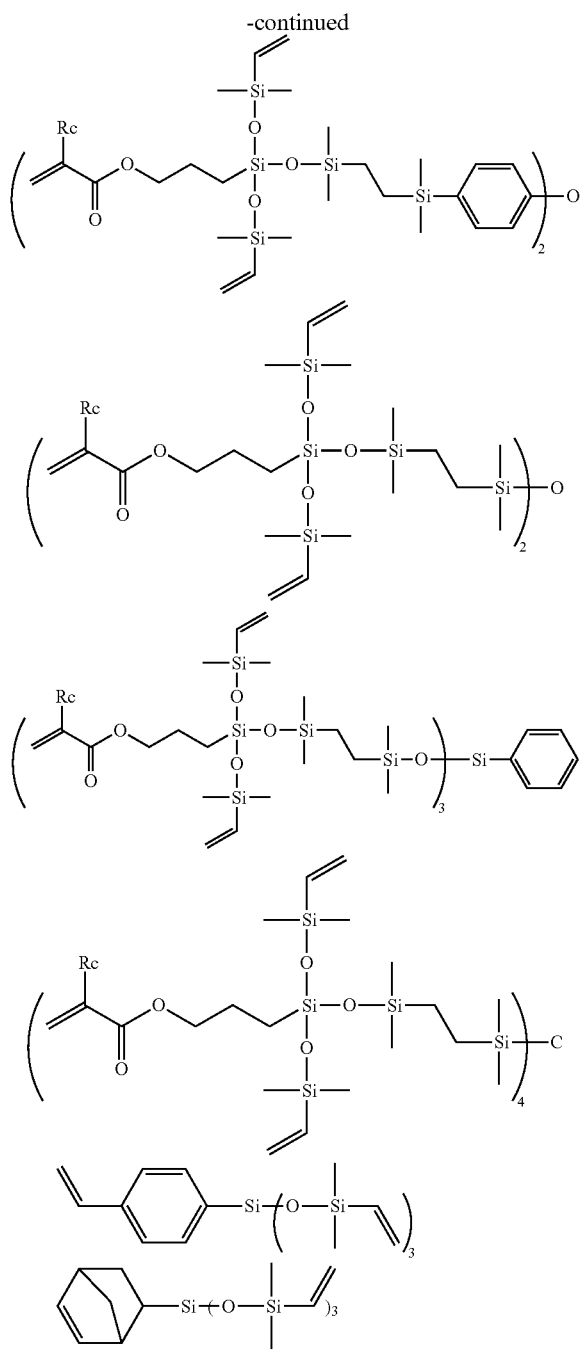

Still other polymerizable compound may be contained in the present invention, where the other polymerizable compound preferably has a vinyl ether group. This sort of compound is arbitrarily selectable from publicly known compounds exemplified by 2-ethylhexyl vinyl ether, butanediol-1,4-divinyl ether, diethylene glycol monovinyl ether, diethylene glycol monovinyl ether, ethylene glycol divinyl ether, triethylene glycol divinyl ether, 1,2-propanediol divinyl ether, 1,3-propanediol divinyl ether, 1,3-butanediol divinyl ether, 1,4-butanediol divinyl ether, tetramethylene glycol divinyl ether, neopentyl glycol divinyl ether, trimethylolpropane trivinyl ether, trimethylolethane trivinyl ether, hexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,1,1-tris[4-(2-vinyloxyethoxy)phenyl]ethane, bisphenol A and divinyloxyethyl ether.

The polymerizable compound having (meth)acryl group(s) is preferably compounds having one to six (meth)acryl groups, and more preferably compounds having two to three (meth)acryl groups from the viewpoints of viscosity and curability.

The polymerizable unsaturated monomer having one (meth)acryl group (mono-functional polymerizable unsaturated monomer) is specifically exemplified by 2-acryloyloxyethyl phthalate, 2-acryloyloxy-2-hydroxyethyl phthalate, 2-acryloyloxyethyl hexahydrophthalate, 2-acryloyloxypropyl phthalate, 2-ethyl-2-butylpropanediol acrylate, 2-ethylhexyl(meth)acrylate, 2-ethylhexyl carbitol (meth)acrylate, 2-hydroxybutyl(meth)acrylate, 2-hydroxyethyl(meth)acrylate, 2-hydroxypropyl(meth)acrylate, 2-methoxyethyl(meth)acrylate, 3-methoxybutyl(meth)acrylate, 4-hydroxybutyl(meth)acrylate, acrylic acid dimer, benzyl(meth)acrylate, 1- or 2-naphthyl(meth)acrylate, 1- or 2-naphthylmethyl(meth)acrylate, 1- or 2-naphthylethyl(meth)acrylate, butanediolmono(meth)acrylate, butoxyethyl(meth)acrylate, butyl(meth)acrylate, cetyl(meth)acrylate, ethylene oxide-modified (referred to as "EO", hereinafter) cresol(meth)acrylate, dipropylene glycol(meth)acrylate, ethoxylated phenyl(meth)acrylate, ethyl(meth)acrylate, isoamyl(meth)acrylate, isobutyl(meth)acrylate, isooctyl(meth)acrylate, cyclohexyl(meth)acrylate, isobornyl(meth)acrylate, dicyclopentanyl(meth)acrylate, dicyclopentanyloxyethyl(meth)acrylate, 1-adamantyl(meth)acrylate, 1-adamantylmethyl(meth)acrylate, isomyristyl(meth)acrylate, lauryl(meth)acrylate, methoxydipropylene glycol(meth)acrylate, methoxytripropylene glycol(meth)acrylate, methoxypolyethylene glycol(meth)acrylate, methoxytriethylene glycol(meth)acrylate, methyl(meth)acrylate, neopentyl glycol benzoate(meth)acrylate, nonylphenoxypolyethylene glycol(meth)acrylate, nonylphenoxypolypropylene glycol(meth)acrylate, octyl(meth)acrylate, paracumylphenoxyethylene glycol(meth)acrylate, epichlorohydrin (referred to as "ECH", hereinafter)-modified phenoxy acrylate, phenoxyethyl(meth)acrylate, phenoxydiethylene glycol(meth)acrylate, phenoxyhexaethylene glycol (meth)acrylate, phenoxytetraethylene glycol(meth)acrylate, polyethylene glycol(meth)acrylate, polyethylene glycol-polypropylene glycol(meth)acrylate, polypropylene glycol (meth)acrylate, stearyl(meth)acrylate, EO-modified succinate(meth)acrylate, tert-butyl(meth)acrylate, tribromophenyl(meth)acrylate, EO-modified tribromophenyl(meth)acrylate, and tridodecyl(meth)acrylate.

It is also preferable to use the multi-functional polymerizable unsaturated monomer having two (meth)acryl groups.

Examples of bifunctional polymerizable unsaturated monomer having two (meth)acryl groups, preferably used in the present invention, include diethylene glycol monoethyl ether(meth)acrylate, dimethylol dicyclopentane di(meth)acrylate, di(meth)acrylated isocyanurate, 1,3-butylene glycol di(meth)acrylate, 1,4-butanediol di(meth)acrylate, EO-modified 1,6-hexanediol di(meth)acrylate, ECH-modified 1,6-hexanediol di(meth)acrylate, aryloxypolyethylene glycol acrylate, 1,9-nonanediol di(meth)acrylate, EO-modified bisphenol A di(meth)acrylate, PO-modified bisphenol A di(meth)acrylate, modified bisphenol A di(meth)acrylate, EO-modified bisphenol F di(meth)acrylate, ECH-modified hexahydrophthalate diacrylate, hydroxypivalic acid neopentyl glycol di(meth)acrylate, neopentyl glycol di(meth)acrylate, EO-modified neopentyl glycol diacrylate, propylene oxide (referred to as "PO", hereinafter)-modified neopentyl glycol diacrylate, caprolactone-modified hydroxypivalate ester neopentyl glycol, stearic acid-modified pentaerythritol di(meth)acrylate, ECH-modified phthalate di(meth)acrylate, poly(ethylene glycol-tetramethylene glycol)di(meth)acrylate, poly(propylene glycol-tetramethylene glycol)di(meth)acrylate, polyester (di)acrylate, polyethylene glycol di(meth)acrylate, polypropylene glycol di(meth)acrylate, ECH-modified propylene glycol di(meth)acrylate, silicone di(meth)acrylate, triethylene glycol di(meth)acrylate, tetraethylene glycol di(meth)acrylate, dimethylol tricyclodecane di(meth)acrylate, neopentyl glycol-modified trimethylolpropane di(meth)acrylate, tripropylene glycol di(meth)acrylate, EO-modified tripropylene glycol di(meth)acrylate, triglycerin di(meth)acrylate, dipropylene glycol di(meth)acrylate, divinylethylene urea, and divinylpropylene urea.

Among them, in particular, neopentyl glycol di(meth)acrylate, 1,9-nonanediol di(meth)acrylate, tripropylene glycol di(meth)acrylate, tetraethylene glycol di(meth)acrylate, hydroxypivalic acid neopentyl glycol di(meth)acrylate, polyethylene glycol di(meth)acrylate, dicyclopentane dimethanol di(meth)acrylate, and p- or m-xylylene di(meth)acrylate are preferably used in the present invention.

Examples of the multi-functional polymerizable unsaturated monomer having three or more (meth)acryl groups include ECH-modified glycerol tri(meth)acrylate, EO-modified glycerol tri(meth)acrylate, PO-modified glycerol tri(meth)acrylate, pentaerythritol triacrylate, EO-modified phosphoric triacrylate, trimethylolpropane tri(meth)acrylate, caprolactone-modified trimethylolpropane tri(meth)acrylate, EO-modified trimethylolpropane tri(meth)acrylate, PO-modified trimethylolpropane tri(meth)acrylate, tris(acryloxyethyl) isocyanurate, dipentaerythritol hexa(meth)acrylate, caprolactone-modified dipentaerythritol hexa(meth)acrylate, dipentaerythritolhydroxy penta(meth)acrylate, alkyl-modified dipentaerythritol penta(meth)acrylate, dipentaerythritol poly(meth)acrylate, alkyl-modified dipentaerythritol tri(meth)acrylate, ditrimethylolpropane tetra(meth)acrylate, pentaerythritolethoxy tetra(meth)acrylate, and pentaerythritol tetra(meth)acrylate.

Among them, in particular, EO-modified glycerol tri(meth)acrylate, PO-modified glycerol tri(meth)acrylate, trimethylolpropane tri(meth)acrylate, trimethylolethane tri(meth)acrylate, EO-modified trimethylolpropane tri(meth)acrylate, PO-modified trimethylolpropane tri(meth)acrylate, dipentaerythritol hexa(meth)acrylate, pentaerythritolethoxy tetra(meth)acrylate, pentaerythritol tetra(meth)acrylate, and dipentaerythritol hexa(meth)acrylate are preferably used in the present invention.

Also a polymer compound which contains a repeating unit having (meth)acrylate group(s) and/or a terminal group having (meth)acrylate group(s), is preferably used.

Among the (meth)acrylate compounds, the acrylate compounds are more preferable from the viewpoint of curability. The content of the acrylate compound relative to the total (meth)acrylate compounds contained in the composition preferably accounts for 70% by mass or more, and more preferably accounts for 80% by mass or more.

For the purpose of improving the releasability from the mold, the composition preferably contains a polymerizable compound having at least either one of fluorine atoms and silicon atom(s) (but excluding those corresponded to the compound (Ax-1)).

The polymerizable compound in the present invention, having at least either one of fluorine atoms and silicon atom(s), is a compound which has at least one group containing fluorine atom, silicon atom, or both of fluorine atom and silicon atom, and at least one polymerizable functional group. The polymerizable functional group is preferably a methacryloyl group, vinyl group, epoxy group or vinyl ether group.

The polymerizable compound having at least either one of fluorine atoms and silicon atom(s) may be either a low molecular weight compound or a polymer.

When polymerizable compound having at least either one of fluorine atoms and silicon atom(s) is a polymer, the compound may have a repeating unit having at least either one of fluorine atoms and silicon atom(s), and, as a copolymerizable component, a repeating unit having a polymerizable group in the side chain thereof. The repeating unit having at least either one of fluorine atoms and silicon atom(s) may have a polymerizable group in the side chain thereof and, in particular, at the terminal. In this case, while the skeleton of the repeating unit having at least either one of fluorine atoms and silicon atom(s) is not specifically limited without departing from the spirit of the present invention, the repeating unit preferably has, for example, a skeleton derived from an ethylenic unsaturated bond, and more preferably has a (meth)acrylate skeleton. In the repeating unit having a silicon atom, the silicon atom per se may form a repeating unit, just like that in a siloxane structure (dimethylsiloxane structure, for example). The weight-average molecular weight is preferably 2,000 to 100,000, more preferably 3,000 to 70,000, and particularly 5,000 to 40,000.

While the content thereof in the curable composition for imprints of the present invention is not specifically limited, the content relative to the total polymerizable compounds is preferably 0.1 to 20% by mass from the viewpoints of improving the curability and reducing the viscosity of the composition, more preferably 0.2 to 15% by mass, furthermore preferably 0.5 to 10% by mass, and particularly 0.5 to 5% by mass.

Polymerizable Compound Having Fluorine Atoms

A group having fluorine atoms, owned by the polymerizable compound having fluorine atoms, is preferably a fluorine-containing group selected from fluoroalkyl group and fluoroalkyl ether group.

The fluoroalkyl group is preferably a $C_{2-20}$ fluoroalkyl group, and more preferably $C_{4-8}$ fluoroalkyl group. Preferable examples of the fluoroalkyl group include trifluoromethyl group, pentafluoroethyl group, heptafluoropropyl group, hexafluoroisopropyl group, nonafluorobutyl group, tridecafluorohexyl group, and heptadecafluorooctyl group.

In the present invention, the polymerizable compound having fluorine atoms is preferably a polymerizable compound having fluorine atom, which has a trifluoromethyl group structure. By virtue of the trifluoromethyl group structure, the polymerizable compound having fluorine atoms can exhibit the effects of the present invention with only a small amount of addition (10% by mass or below, for example), so that the compatibility with the other component may be improved, the line edge roughness after dry-etched may be improved, and the repetitive patternability may be improved.

Similarly to the case of fluoroalkyl group, the fluoroalkyl ether group preferably has a trifluoromethyl group, wherein the one having perfluoroethylenoxy group or perfluoropropylenoxy group is preferable. The fluoroalkyl ether group is preferably a fluoroalkyl ether unit having a trifluoromethyl group such as —(CF(CF$_3$)CF$_2$O)—, and/or the one having a trifluoromethyl group at the terminal of the fluoroalkyl ether group.

The total number of fluorine atoms owned by the polymerizable compound having at least either one of fluorine atoms and silicon atoms is preferably 6 to 60 per molecule, more preferably 9 to 40, furthermore preferably 12 to 40, and particularly 12 to 20.

The polymerizable compound having at least either one of fluorine atoms and silicon atoms has a ratio of fluorine content of 20 to 60%. If the polymerizable compound having at least either one of fluorine atoms and silicon atoms is a polymerizable compound, the ratio of fluorine content is preferably 20 to 60%, and more preferably 35 to 60%. If the compound is a polymer having a polymerizable group, the ratio of fluorine content is more preferably 20 to 50%, and furthermore preferably 20 to 40%. By adjusting the ratio of fluorine content in an appropriate range, the polymerizable compound will have a good compatibility with the other component, reduced in mold pollution, improved in the line edge roughness after dry etching, and improved in the repetitive patternability. In this specification, the ratio of fluorine content is given by the equation below.

[Chemical Formual 26]

$$\text{Ratio of fluorine content} = \frac{(\text{Number of fluorine atoms in polymerizable compound}) \times (\text{Atomic weight of fluorine atom})}{\text{Molecular weight of polymerizable compound}} \times 100$$

A fluorine atom-containing group in the polymerizable compound having at least either one of fluorine atoms and silicon atom(s) is exemplified by compounds having a partial structure represented by the formula (I) below. By using the compound having this sort of partial structure, the curable composition will exhibit a good patternability even after repetitive pattern transfer, and will ensure a good long-term stability.

Formula (I)

—CH$_2$CH$_2$—C$_n$F$_{2n+1}$ [Chemical Formula 27]

In the formula (I), n represents an integer of 1 to 8, and preferably an integer of 4 to 6.

Other preferable examples of the polymerizable compound having at least either one of fluorine atoms and silicon atom(s) include the compound having a partial structure represented by the formula (II) below. The compound may, of course, have both of the partial structure represented by the formula (I), and the partial structure represented by the formula (II).

Formula (II)

[Chemical Formula 28]

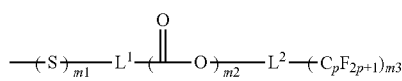

In the formula (II), L$^1$ represents a single bond or C$_{1-8}$ alkylene group, L$^2$ represents a C$_{1-8}$ alkylene group, each of m1 and m2 independently represents 0 or 1, and at least one of m1 and m2 is 1. m3 represents an integer of 1 to 3, and p represents an integer of 1 to 8. When m3 is 2 or larger, the individual (—C$_p$F$_{2p+1}$)s may be same or different.

It is preferable that each of L$^1$ and L$^2$ independently represents a C$_{1-4}$ alkylene group. The alkylene group may have a substituent without departing from the spirit of the present invention. m3 is preferably 1 or 2. p is preferably an integer of 4 to 6.

Specific examples of the polymerizable compound having fluorine atoms, used for the photo-curable composition used in the present invention, will be shown below without limiting the present invention.

The polymerizable compound having fluorine atoms is exemplified by monofunctional polymerizable compound having fluorine atoms, such as trifluoroethyl(meth)acrylate, pentafluoroethyl(meth)acrylate, (perfluorobutyl)ethyl(meth)acrylate, perfluorobutyl-hydroxypropyl(meth)acrylate, (perfluorohexyl)ethyl(meth)acrylate, octafluoropentyl(meth)acrylate, perfluorooctylethyl(meth)acrylate, tetrafluoropropyl(meth)acrylate, and hexafluoropropyl(meth)acrylate. As the polymerizable compound having fluorine atoms, also preferably exemplified are multi-functional polymerizable compounds having two or more polymerizable functional groups, which contain di(meth)acrylate having fluoroalkylene groups, such as 2,2,3,3,4,4-hexafluoropentane di(meth)acrylate and 2,2,3,3,4,4,5,5-octafluorohexane di(meth)acrylate.

Also compounds having two or more fluorine-containing groups in one molecule, such as fluoroalkyl group or fluoroalkyl ether group, are preferably used.

The compounds having two or more fluoroalkyl groups or fluoroalkyl ether groups in one molecule are preferably polymerizable compounds represented by the formula (III) below:

[Chemical Formula 29]

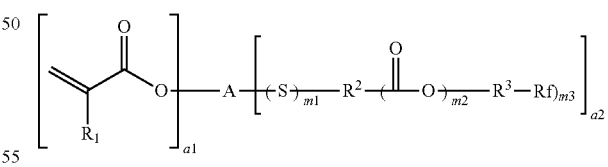

(III)

(in the formula (III), R$^1$ represents a hydrogen atom, alkyl group, halogen atom or cyano group, preferably represents a hydrogen atom or alkyl group, more preferably represents a hydrogen atom or methyl group, and furthermore preferably represents a hydrogen atom.

"A" represents an (a1+a2)-valent linking group, preferably represents a linking group having an alkylene group and/or arylene group, and may further contain a linking group having a hetero atom. The linking group having a hetero atom is exemplified by —O—, —C(=O)O—, —S— and —C(=O)—. While these groups may have a substituent without departing from the spirit of the present invention, they preferably have no substituent. "A" preferably has 2 to 50 carbon atoms, and more preferably has 4 to 15 carbon atoms.

a1 represents an integer of 1 to 6, preferably 1 to 3, and furthermore preferably 1 or 2.

a2 represents an integer of 2 to 6, preferably 2 or 3, and furthermore preferably 2.

Each of $R^2$ and $R^3$ independently represents a single bond or $C_{1-8}$ alkylene group. Each of m1 and m2 independently represents 0 or 1, and m3 represents an integer of 1 to 3.)

When a1 is 2, the individual (A)s may be same or different.

When a2 is 2, the individual $(R^2)$s, $(R^3)$s, (m1)s, (m2) s and (m3)s, respectively, may be same or different.

Rf represents a fluoroalkyl group or fluoroalkyl ether group, and preferably represents a $C_{1-8}$ fluoroalkyl group, or $C_{3-20}$ fluoroalkyl ether group.

When the polymerizable compound having fluorine atoms is a polymer, the polymer preferably contains a polymerizable compound having fluorine atoms as a repeating unit.

From the viewpoint of compatibility with other component, the polymerizable compound having fluorine atoms preferably contains no silicon atom.

Specific examples of the polymerizable compound having fluorine atoms, used for the photo-curable composition used in the present invention will be shown below, without limiting the present invention. Each $R^1$ in the formulae below independently represents any one of hydrogen atom, alkyl group, halogen atom and cyano group.

[Chemical Formula 30]

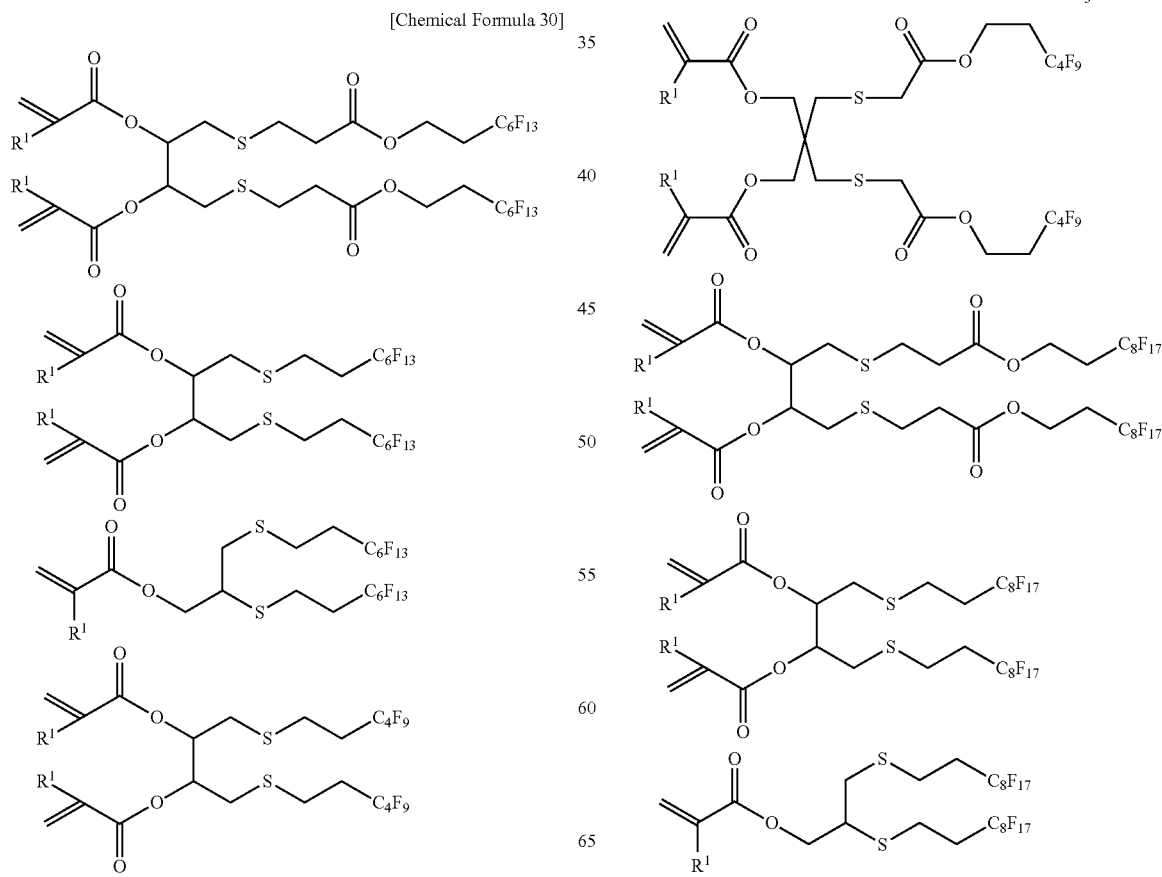

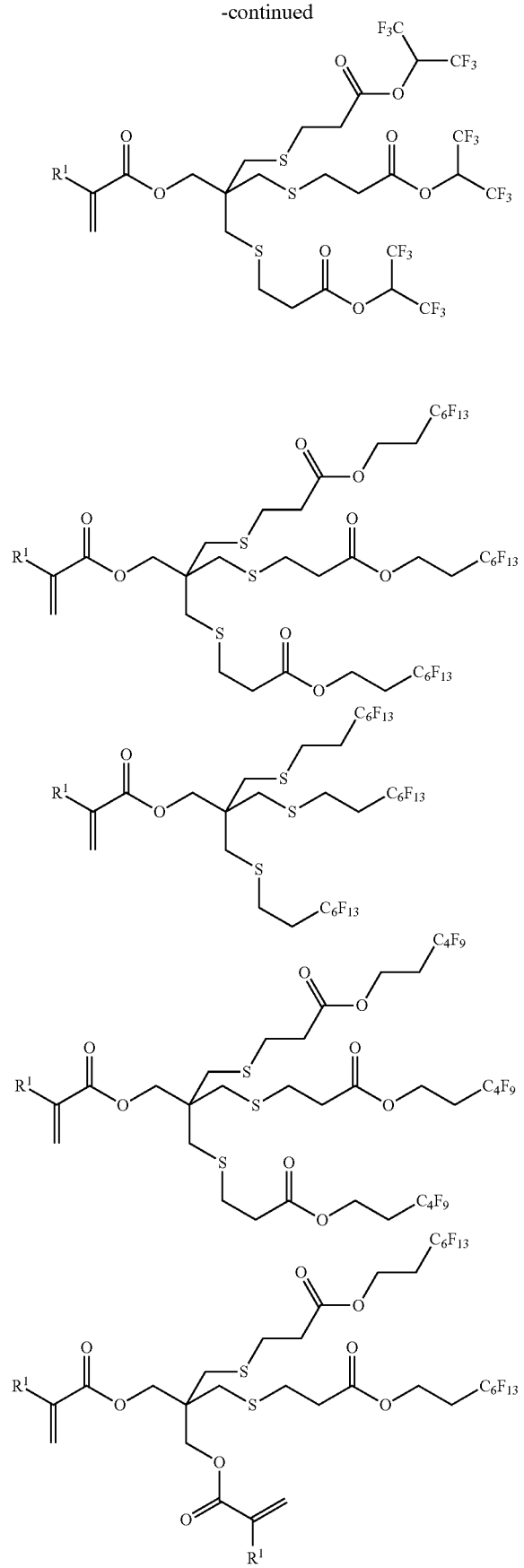
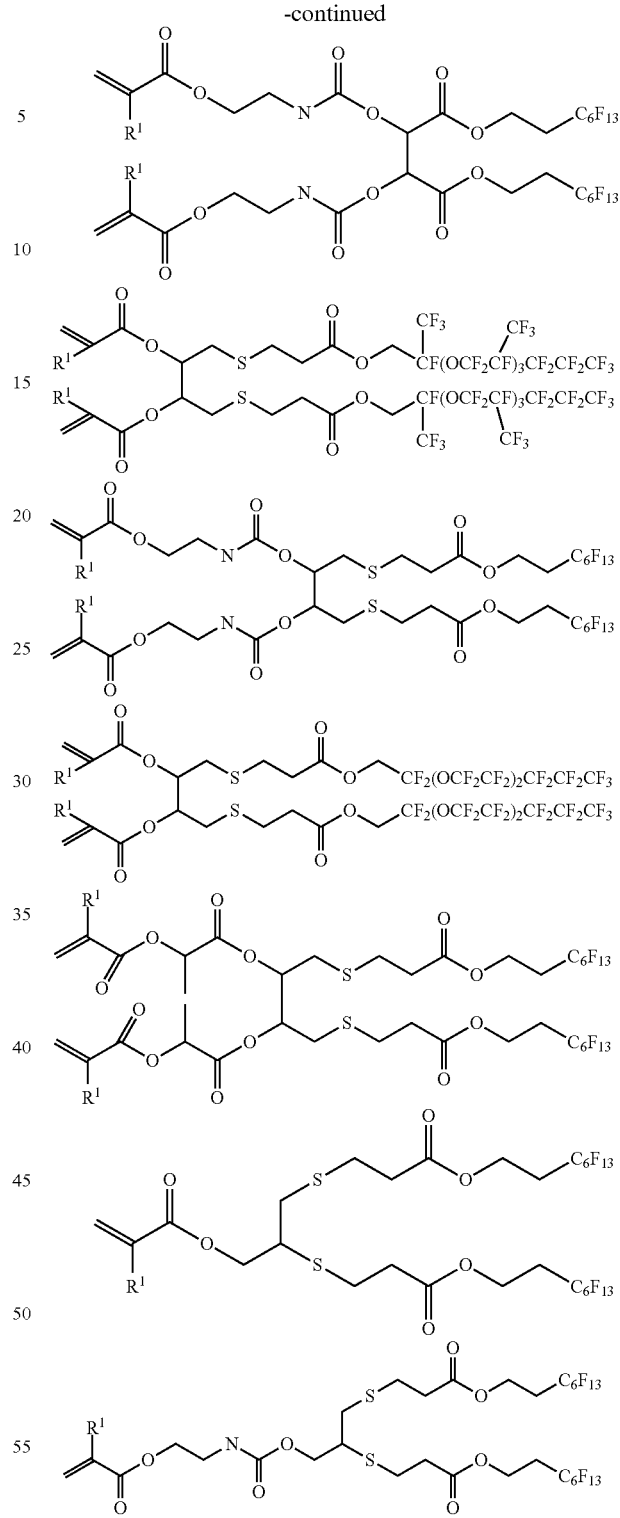

Polymerizable Compound Having Silicon Atom(s)

Functional group having silicon atom(s), owned by the polymerizable compound having silicon atom(s), is exemplified by trialkylsilyl group, chain-like siloxane structure, cyclic siloxane structure, and basket-like siloxane structure. From the viewpoints of compatibility with other component and mold releasability, functional groups having a trimethylsilyl group or dimethylsiloxane structure are preferable.

From the viewpoint of compatibility with other component, the polymerizable compound having silicon atom(s) preferably contains no fluorine atom.

The polymerizable compound having silicon atom(s) is exemplified by 3-tris(trimethylsilyloxy)silylpropyl(meth)acrylate, trimethylsilylethyl(meth)acrylate, (meth)acryloxymethyl bis(trimethylsiloxy)methylsilane, (meth)acryloxymethyl tris(trimethylsiloxy)silane, 3-(meth)acryloxypropyl bis(trimethylsiloxy)methylsilane, and polysiloxane having a (meth)acryloyl group at the terminal or in the side chain (for example, X-22-164 Series, X-22-174DX, X-22-2426 and X-22-2475 from Shin-Etsu Chemical Co., Ltd.).

It is preferable that the polymerizable compound contained in the curable composition of the present invention has 0.5 to 3, preferably 1 to 2, maleimide groups per molecule on the average of the whole polymerizable compound, and contains 0.5 to 5, preferably 1 to 3, vinyl groups per molecule on the average of the whole polymerizable compound. It is also preferable that the polymerizable compound contained in the curable composition of the present invention has 1 to 7, preferably 1 to 5, silicon atoms per molecule, on the average of the whole polymerizable compound.

A second embodiment of the curable composition for imprints of the present invention relates to a curable composition for imprints which contains the compound (Ax-2) having a partial structure represented by the formula (I) below (simply referred to as "compound (Ax-2)" on occasions, hereinafter), and, the photo-polymerization initiator (B):

Formula (I)

[Chemical Formula 31]

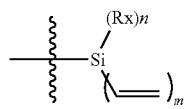

(in the formula (I), Rx represents an alkyl group or aryl group. m represents an integer of 1 to 3, and n represents an integer of 0 to 2, where m+n=3.)

General curable compositions, such as acrylate curable composition and epoxy curable composition, are excellent in the curability but poor in the heat resistance of the cured product. In particular, under high temperature conditions exceeding 300° C., the cured product shrunk and the pattern deformed, due to decomposition typically ascribable to cleavage of bonds. The present inventors found that, by using the compound having silicon atom(s), and specific carbon-carbon multiple bond(s) in this embodiment, it became now possible to form a more heat-resistant crosslinkage structure without leaving carbon-oxygen bond at the crosslinked portion, and thereby the pattern may be suppressed from deforming even under higher temperature conditions such as exceeding 300° C. The present invention was thus completed.

Compound (Ax-2) Having Carbon-Carbon Multiple Bond(s)

The compound (Ax-2) component used in the present invention has a partial structure represented by the formula (I) below:

Formula (I)

[Chemical Formula 32]

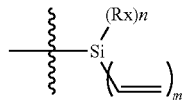

(in the formula (I), Rx represents an alkyl group or aryl group. m represents an integer of 1 to 3, and n represents an integer of 0 to 2, where m+n=3.)

The alkyl group represented by Rx is preferably a $C_{1-4}$ alkyl group, and more preferably a methyl group.

The aryl group represented by Rx is preferably a phenyl group or naphthyl group, and more preferably a phenyl group. The aryl group may have a substituent.

m represents 1 to 3, and preferably 1. n represents 0 to 2, and preferably 2.

The partial structure represented by the formula (I) combines with other substituent at the wavy line. It is, however, preferable that the silicon atom has thereon no halogen atom, alkoxy group, acyloxy group or hydroxy group as the substituent, from the viewpoint of long-term stability. This sort of silicon atom is intended for excluding silane coupling agent. The compound (Ax-2) preferably contains 1 to 25, more preferably 2 to 20, and furthermore preferably 3 to 10 silicon atoms per molecule.

Ratio of silicon atom content of the compound (Ax-2) used in the present invention is preferably 10 to 50%, more preferably 15 to 40%, furthermore preferably 20 to 35%, and particularly 20 to 30%.

Ratio of silicon atom content is given by [(number of silicon atoms in compound (Ax-2))×(atomic weight of silicon atom)/molecular weight of compound (Ax-2)]×100.

The compound (Ax-2) preferably contains a partial structure represented by silicon atom-oxygen atom-silicon atom.

It is preferable that 1 to 10 partial structures represented by the formula (I) are contained in the compound (Ax-2), the number of which is more preferably 2 to 8, and furthermore preferably 3 to 6.

The compound (Ax-2) may be either a polymer compound or a non-polymer compound, where the non-polymer compound is preferable. The molecular weight is preferably 150 to 2,000, more preferably 200 to 1,500, and furthermore preferably 300 to 1,200. By adjusting the molecular weight in the appropriate range, both of low viscosity and low volatility are satisfied, and readiness of mold filling and patternability are improved.

The compound (Ax-2) used in the present invention is preferably has a partial structure represented by the formula (II) below:

Formula (II)

[Chemical Formula 33]

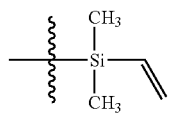

It is preferable for the polymer compound as the compound (Ax-2) to additionally contain a repeating unit having a (meth)acrylate group and/or terminal group having a (meth)acrylate group, and more preferably to contain a repeating unit (Z1) and/or terminal group (Z2), respectively represented as below:

[Chemical Formula 34]

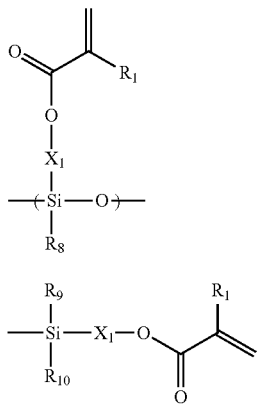

$X_1$ represents a linking group, preferably an alkylene group, and more preferably a propylene group.

$R_8$ represents a hydrogen atom, alkyl group (preferably methyl group) or aryl group (preferably phenyl group).

Each of $R_9$ and $R_{10}$ independently represents a hydrogen atom, alkyl group (preferably methyl group) or aryl group (preferably phenyl group).

$R_1$ represents a hydrogen atom or methyl group.

From the viewpoint of improved curing sensitivity, it is preferable for the compound (Ax-2) to additionally has a group selected from (meth)acryl group, vinyl ether group, epoxy group and oxetane group, wherein (meth)acrylate group is more preferable. The compound (Ax-2) preferably has 1 to 4, more preferably 1 to 3, and furthermore preferably 1 or 2 (meth)acrylate groups.

A compound represented by the formula (III) or formula (IV) is particularly preferable in the present invention.

Formula (III)

(meth)acryloyloxy group-alkylene group-
    Si—(R)₃  [Chemical Formula 35]

(In the formula (III), each R independently represents a methyl group or —O—Si(CH₃)₂—CH=CH₂, wherein at least one R represents —O—Si(CH₃)₂—CH=CH₂.)

Formula (IV)

[Chemical Formula 36]

((meth)acryloyloxy group-alkylene group-Si$\frac{(R)_2}{n1}$—Ry (In the formula (IV), each R independently represents a methyl group or —O—Si(CH₃)₂—CH=CH₂, and at least one R represents —O—Si(CH₃)₂—CH=CH₂. Ry represents an n1-valent linking group. n1 represents an integer of 2 to 6.)

Ry represents an n1-valent linking group, preferably a linking group having silicon atom and/or oxygen atom, and more preferably a linking group additionally having arylene group and/or alkylene group.

n1 represents 2 to 6, preferably 2 to 4, and more preferably 2 or 3.

The non-polymer compound as the compound (Ax-2) is specifically exemplified by the compounds below. The compound (Ax-2) used in the present invention is, of course, not limited thereto. Each $R^1$ in the formulae below independently represents any one of hydrogen atom, alkyl group, halogen atom and cyano group.

[Chemical Formula 37]

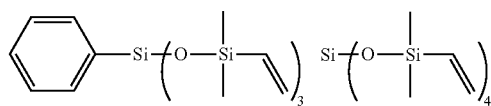

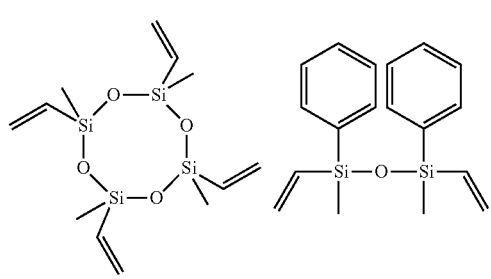

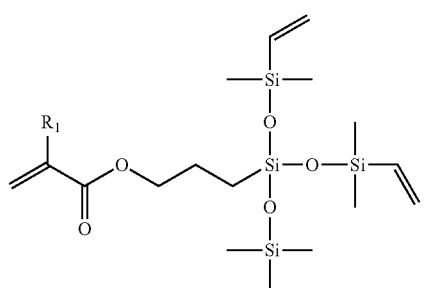

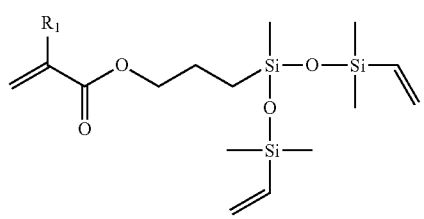

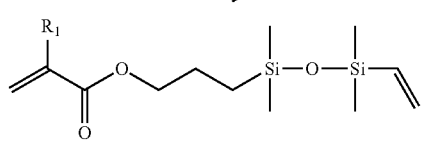

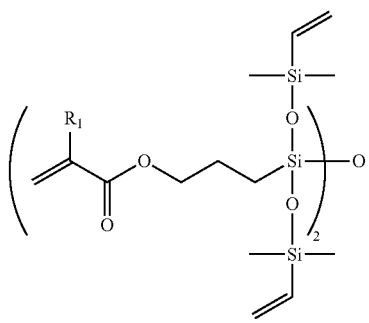

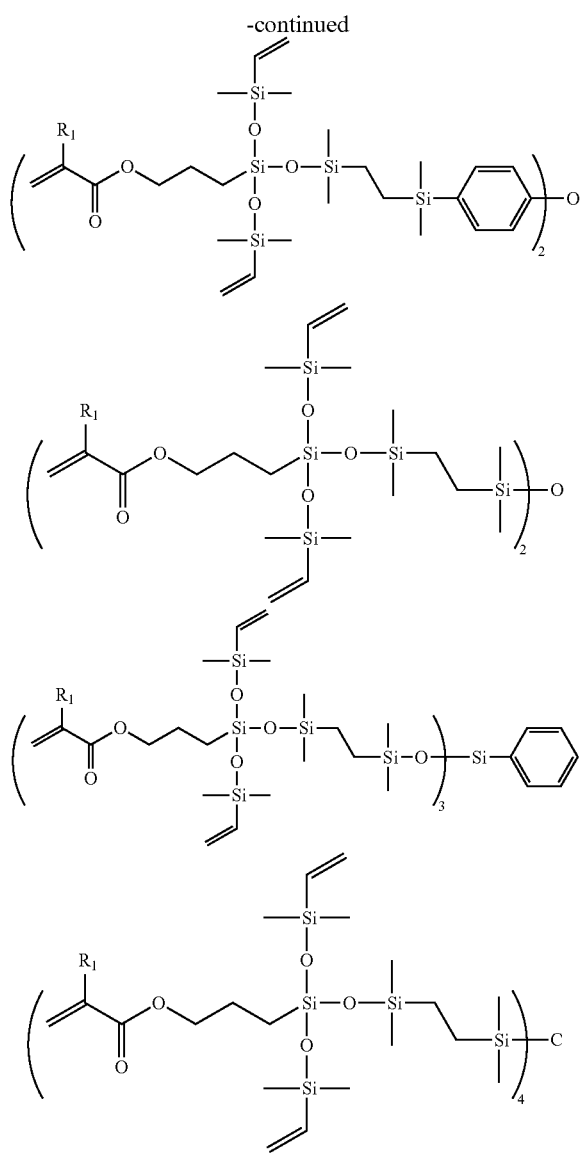

Content of the compound (Ax-2) used in the present invention is preferably accounts for 30 to 99% by mass of the total components, excluding the solvent, of the composition of the present invention, more preferably 40 to 97% by mass, and furthermore preferably 60 to 95% by mass.

Other Polymerizable Monomer

It is preferable for the curable composition of the present invention to additionally contain a polymerizable compound different from (Ax-2). The polymerizable compound is preferably a radical-polymerizable compound (preferably compound having (meth)acryl group), or, cation-polymerizable compound (preferably polymerizable compound having a group selected from vinyl ether group, epoxy group and oxetane group).

Polymerizable Compound Having (Meth)Acryl Group

Polymerizable unsaturated monomer (monofunctional polymerizable unsaturated monomer) having one (meth)acryl group, multi-functional polymerizable unsaturated monomer having two (meth)acryl groups, and multi-functional polymerizable unsaturated monomer having three or more (meth)acryl groups are exemplified by those described above in the first embodiment, with the same preferable ranges and so forth.

Among the (meth)acrylate compounds, the acrylate compound is more preferable from the viewpoint of curability. The acrylate compound preferably accounts for 70% by mass or more, and more preferably 80% by mass or more, of the total (meth)acrylate compounds contained in the composition.

Also vinyl ether compound is preferable as the polymerizable compound used in the present invention. The vinyl ether compound is arbitrarily selectable from those publicly known, and is exemplified by vinyl ether compounds mentioned above in the first embodiment.

These vinyl ether compounds are synthesized by a method described, for example, in Stephen. C. Lapin, *Polymers Paint Colour Journal.*, 179 (4237), 321 (1988), that is, a method based on a reaction of a polyhydric alcohol or polyhydric phenol with acetylene, or a reaction of a polyhydric alcohol or a polyhydric phenol with a halogenated alkyl vinyl ether. Only a single species of them may be used independently, or two or more species may be used in combination.

A compound having an oxirane ring (epoxy compound) is exemplified by polyglycidyl esters of polybasic acid, polyglycidyl ethers of polyhydric alcohol, polyglycidyl ethers of polyoxyalkylene glycol, polyglycidyl ethers of aromatic polyol, hydrogenated compounds of polyglycidyl ethers of aromatic polyol, urethane polyepoxy compound and epoxylated polybutadienes. Only a single species of these compounds may be used independently, or two or more species may be used in combination.

The compounds having an oxirane ring (epoxy compound) preferably used in the present invention are exemplified by bisphenol A diglycidyl ether, bisphenol F diglycidyl ether, bisphenol S diglycidyl ether, brominated bisphenol A diglycidyl ether, brominated bisphenol F diglycidyl ether, brominated bisphenol S diglycidyl ether, hydrogenated bisphenol A diglycidyl ether, hydrogenated bisphenol F diglycidyl ether, hydrogenated bisphenol S diglycidyl ether, 1,4-butanediol diglycidyl ether, 1,6-hexanediol diglycidyl ether, glycerin triglycidyl ether, trimethylolpropane triglycidyl ether, polyethylene glycol diglycidyl ether, polypropylene glycol diglycidyl ethers; polyglycidyl ethers of polyether polyol obtained by adding one species, or two or more species of alkylene oxide to an aliphatic polyhydric alcohol such as ethylene glycol, propylene glycol and glycerin; diglycidyl esters of aliphatic long-chain dibasic acid; monoglycidyl ethers of aliphatic higher alcohol; monoglycidyl ethers of phenol, cresol, butyl phenol or polyether alcohols obtained by adding thereto an alkylene oxide; and glycidyl esters of higher fatty acid.

Among them, bisphenol A diglycidyl ether, bisphenol F diglycidyl ether, hydrogenated bisphenol A diglycidyl ether, hydrogenated bisphenol F diglycidyl ether, 1,4-butanediol diglycidyl ether, 1,6-hexanediol diglycidyl ether, glycerin triglycidyl ether, trimethylolpropane triglycidyl ether, neopentyl glycol diglycidyl ether, polyethylene glycol diglycidyl ether, and polypropylene glycol diglycidyl ether are particularly preferable.

Commercially available products successfully usable as the glycidyl group-containing compound include UVR-6216 (from Union Carbide Corporation), glycidol, AOE X24 and Cyclomer A200 (all from Daicel Corporation), Epikote 828, Epikote 812, Epikote 1031, Epikote 872 and Epikote CT508 (all from Yuka Shell K.K.), KRM-2400, KRM-2410, KRM-2408, KRM-2490, KRM-2720 and KRM-2750 (all from ADEKA Corporation). Only a single species of them may be used independently, or two or more species may be used in combination.

These compounds having an oxirane ring may be manufactured by arbitrary methods, and may be synthesized referring, for example, to literatures such as "*Jikken Kagaku Koza (The Course of Experimental Chemistry)*" 20, *Yukigosei* (*Organic Synthesis*) II, 4th Edition, 213-, 1992, Published by Maruzen Co., Ltd.; "*The Chemistry Of Heterocyclic Compounds—Small Ring Heterocycles, Part 3 Oxiranes*", Edited by Alfred Hassner, John & Wiley and Sons, AN Interscience Publication, New York, 1985; Yoshimura, *Secchaku*, Vol. 29, No. 12, 32, 1985; Yoshimura, *Secchaku*, Vol. 30, No. 5, 42, 1986; Yoshimura, *Secchaku*, Vol. 30, No. 7, 42, 1986; JP-A-H11-100378, Japanese Patent No. 2906245, and Japanese Patent No. 2926262.

For the purpose of improving releasability from the mold, the curable composition also preferably contains a polymerizable compound containing at least either one of fluorine atoms and silicon atom(s) (but excluding compounds which correspond to the compound (Ax-2)).

The polymerizable compound having at least either one of fluorine atoms and silicon atom(s) in the present invention is a compound having at least one of fluorine atoms, silicon atom(s), or, a group having both of fluorine atoms and silicon atom(s), and at least one polymerizable functional group. The polymerizable functional group is preferably a methacryloyl group, epoxy group or vinyl ether group. Details of the polymerizable compound having at least one of fluorine atoms and silicon atom(s) are same as those in the first embodiment above, with the same preferable ranges.

The polymerizable compound used in the present invention, different from the compound (Ax-2), is preferably a (meth)acrylate compound having an aromatic group and/or alicyclic hydrocarbon group and/or silicon atom, from the viewpoint of heat resistance.

The (meth)acrylate compound having an aromatic group is exemplified by benzyl(meth)acrylate which is unsubstituted or substituted on the aromatic ring thereof, phenethyl (meth)acrylate which is unsubstituted or substituted on the aromatic ring thereof, phenoxyethyl(meth)acrylate which is unsubstituted or substituted on the aromatic ring thereof, 1- or 2-naphthyl(meth)acrylate which is unsubstituted or substituted on the aromatic ring thereof, 1- or 2-naphthylmethyl (meth)acrylate which is unsubstituted or substituted on the aromatic ring thereof, 1- or 2-naphthylethyl(meth)acrylate which is unsubstituted or substituted on the aromatic ring thereof, 1- or 2-naphthoxyethyl(meth)acrylate, resorcinol di(meth)acrylate, m-xylylene di(meth)acrylate, naphthalene di(meth)acrylate, ethoxylated bisphenol A diacrylate, 4,4'-bis(acryloxymethyl)diphenylmethane, and 4,4'-bis(acryloxymethyl)diphenyl ether.

Preferable examples of the polymerizable compound having an alicyclic hydrocarbon group include monofunctional (meth)acrylate such as isoboronyl(meth)acrylate, 1- or 2-adamantyl(meth)acrylate, 2-alkyl-2-adamantyl(meth) acrylate, tricyclodecanyl(meth)acrylate, cyclohexyl(meth) acrylate, and cyclopentyl(meth)acrylate; and multifunctional (meth)acrylate such as tricyclodecane dimethanol di(meth)acrylate, and 1,3-adamantane di(meth)acrylate.

The (meth)acrylate compound having silicon atom(s) is preferably any of the compounds described above.

Also the aliphatic (meth)acrylate compound, having the (meth)acrylate moiety thereof solely composed of a partial structure represented by the formula below, is preferable:

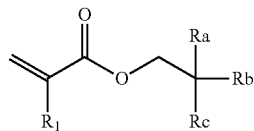

[Chemical Formula 38]

$R_1$ represents a hydrogen atom or methyl group, and each of $R_a$ to $R_c$ independently represents a group other than hydrogen atom. While the (meth)acrylate moiety may be bound via $R_a$ to $R_c$ to other (meth)acrylate group(s), the (meth) acrylate moiety has the partial structure described above.

More specifically, the examples include neopentyl glycol diacrylate, trimethylolethane triacrylate, trimethylolpropane triacrylate, pentaerythritol tetraacrylate, and ditrimethylolpropane tetraacrylate.

The polymerizable compound different from (Ax) is preferably a compound having 2 to 4 (meth)acrylate groups.

(Compound Having Si—H Bond(s))

The photo-curable composition of the second embodiment of the present invention preferably contains a compound having Si—H bond(s).

The compound having Si—H bond(s) is a compound having one or more Si—H bonds in the molecule, preferably a compound having two or more Si—H bonds in the molecule, and furthermore preferably 2 to 10 Si—H bonds in the molecule. A partial structure having the Si—H structure is preferably a —SiH(Me$_2$). The compound having Si—H bonds may be either a polymer compound or non-polymer compound, where the non-polymer compound is preferable. In view of suppressing vaporization of the curable composition when applied onto the substrate, the compound having Si—H bond(s) preferably has a boiling point at 1 atm of 200° C. or above.

Specific examples of the preferable non-polymer compound will be enumerated below:

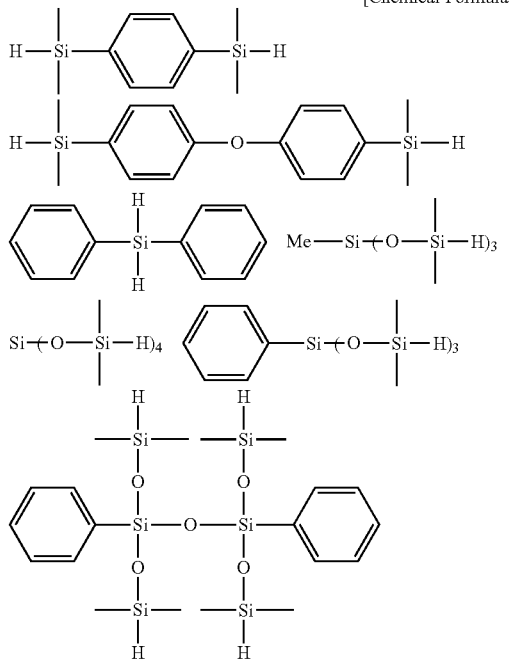

[Chemical Formula 39]

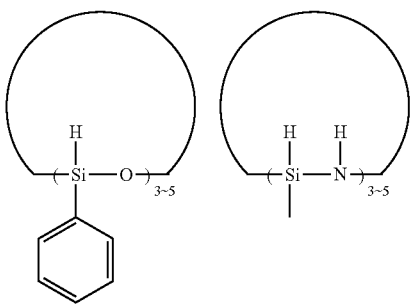

Specific examples of the preferable polymer compound will be enumerated below:

[Chemical Formula 40]

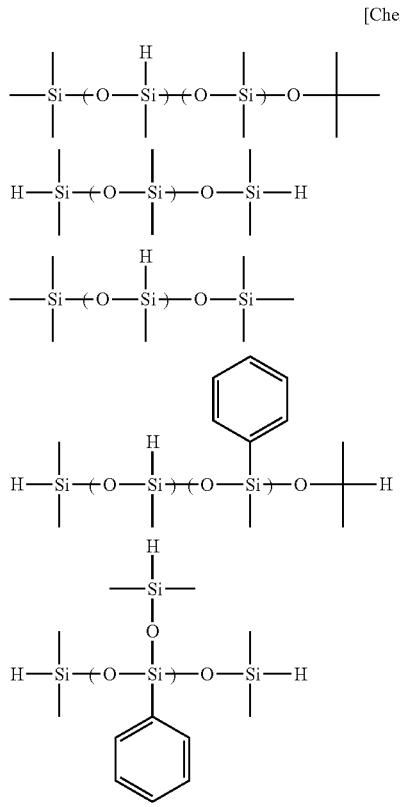

In the present invention, a compound also having a carbon-carbon multiple bond, in addition to the Si—H bond(s) is more preferable, wherein a (meth)acryl group is preferable as the compound having the carbon-carbon multiple bond. Specific examples of the compound will be enumerated below, wherein (AB1) to (AB6) are preferable.

[Chemical Formula 41]

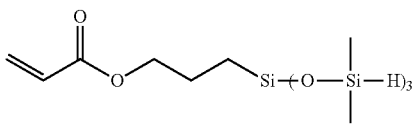
(AB1)

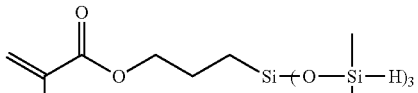
(AB2)

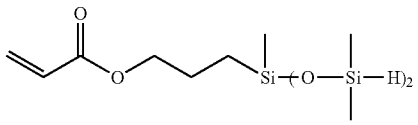
(AB3)

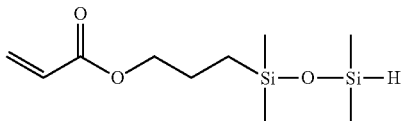
(AB4)

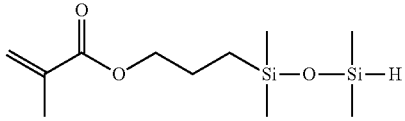
(AB5)

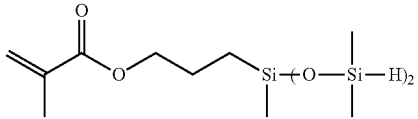
(AB6)

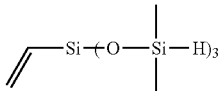
(AB7)

Content of the compound having Si—H bond(s), or content of the compound having a carbon-carbon multiple bond and Si—H bond(s) is preferably 0.1 to 100 parts by weight relative to total 100 parts by weight of the component (Ax-2) and a polymerizable compound different from (Ax-2), more preferably 0.3 to 50 parts by weight, furthermore preferably 0.5 to 30 parts by weight, and most preferably 3 to 20 parts by weight. Content of the component (B) is preferably adjusted so that the number of Si—H bonds accounts for 1 to 50 mol %, preferably 3 to 20 mol %, of the number of carbon-carbon multiple bonds owned by the (Ax-2) component and the polymerizable compound different from (Ax-2).

Polymerization Initiator (B)

The photo-curable composition of the first embodiment used in the present invention preferably contains a photo-polymerization initiator. The photo-curable composition of the second embodiment contains the photo-polymerization initiator as an essential component.

The photo-polymerization initiator used in the present invention is arbitrarily selectable from those capable of producing an active species which polymerizes the polymerizable compound when irradiated with light, wherein a radical polymerization initiator is more preferable. In the present invention, a plurality of species of the photo-polymerization initiator may be used in combination.

Content of the photo-polymerization initiator used in the present invention typically accounts for 0.01 to 15% by mass, preferably 0.1 to 12% by mass, and furthermore preferably 0.2 to 7% by mass of the whole components excluding the solvent. For the case where two or more species of the photo-polymerization initiator are used, the total content falls in the above-described ranges.

A content of the photo-polymerization initiator of 0.01% by mass or more is preferable, since the sensitivity (rapid curability), resolution, line edge roughness performance, and film strength tend to improve. On the other hand, a content of the photo-polymerization initiator of 15% by mass or less is preferable, since the translucency, coloration and handleability tend to improve.

The radical photo-polymerization initiator used in the present invention is selectable, for example, from those commercially available. The examples include those described, for example, in paragraph [0091] of JP-A-2008-105414, which are preferably used. Among them, acetophenone-based compound, acylphosphine oxide-based compound, and oxime ester-based compound are preferable from the viewpoints of curing sensitivity and absorption characteristics.

The acetophenone-based compound is preferably exemplified by hydroxyacetophenone-based compound, dialkoxyacetophenone-based compound, and aminoacetophenone-based compound. The hydroxyacetophenone-based compound is preferably exemplified by Irgacure (registered trademark) 2959 (1-[4-(2-hydroxyethoxy)phenyl]-2-hydroxy-2-methyl-1-pro pane-1-one, Irgacure (registered trademark) 184 (1-hydroxycyclohexyl phenylketone), Irgacure (registered trademark) 500 (1-hydroxycyclohexyl phenylketone, benzophenone), and Darocur (registered trademark) 1173 (2-hydroxy-2-methyl-1-phenyl-1-propane-1-one), all commercially available from BASF GmbH.

The dialkoxyacetophenone-based compound is preferably exemplified by Irgacure (registered trademark) 651 (2,2-dimethoxy-1,2-diphenylethane-1-one) commercially available from BASF GmbH.

The aminoacetophenone-based compound is preferably exemplified by Irgacure (registered trademark) 369 (2-benzyl-2-dimethylamino-1-(4-morpholinophenyl)butanone-1), Irgacure (registered trademark) 379 (EG) (2-dimethylamino-2-(4-methylbenzyl)-1-(4-morpholin-4-yl phenyl)butane-1-one, and Irgacure (registered trademark) 907 (2-methyl-1-[4-methylthiophenyl]-2-morpholinopropane-1-one, all commercially available from BASF GmbH.

The acylphosphine oxide-based compound is preferably exemplified by Irgacure (registered trademark) 819 (bis(2,4,6-trimethylbenzoyl)phenylphosphine oxide, Irgacure (registered trademark) 1800 (bis(2,6-dimethoxybenzoyl)-2,4,4-trimethyl-pentylphosphine oxide, all commercially available from BASF GmbH, Lucirin TPO (2,4,6-trimethylbenzoyl-diphenylphosphine oxide), and Lucirin TPO-L (2,4,6-trimethylbenzoylphenylethoxyphosphine oxide), again all commercially available from BASF GmbH.

The oxime ester-based compound is preferably exemplified by Irgacure (registered trademark) OXE01 (1,2-octanedione, 1-[4-(phenylthio)phenyl]-2-(O-benzoyloxime), Irgacure (registered trademark) OXE02 (ethanone, 1-[9-ethyl-6-(2-methylbenzoyl)-9H-carbazole-3-yl]-, 1-(O-acetyloxime), all commercially available from BASF GmbH.

Note that "light" in the context of the present invention include not only light in the UV, near UV, far UV, visible and infrared regions and electromagnetic wave, but also radiation rays. The radiation rays include microwave, electron beam, EUV, and X-ray. Also laser light such as 248 nm excimer laser, 193 nm excimer laser, 172-nm excimer laser are usable. These lights may be either monochromatic light (single wavelength light) after being passed through an optical filter, or a plurality of lights (combined light) with different wavelengths. Exposure may be either multiple exposure, or whole exposure after formation of the pattern, aimed at enhancing film strength and etching resistance.

—Surfactant—

The curable composition for imprints used in the present invention preferably contains a surfactant. The surfactant used in the present invention is exemplified by those used in the under layer film-forming composition as described above. Content of the surfactant used in the present invention is typically 0.001 to 5% by mass of the whole composition, preferably 0.002 to 4% by mass, and furthermore preferably 0.005 to 3% by mass. When two or more species of surfactant are used, the total content falls in the above-described ranges. If the content of the surfactant falls in the range from 0.001 to 5% by mass of the composition, an effect on uniformity of coating will be good, and degradation in mold transfer characteristics due to excessive surfactant will be less likely to occur.

The surfactant is preferably a nonionic surfactant, preferably contains at least one of fluorine-containing surfactant, Si-based surfactant and fluorine-containing/Si-based surfactant, more preferably contains both of the fluorine-containing surfactant and the Si-based surfactant, or, the fluorine-containing/Si-based surfactant, and most preferably contains the fluorine-containing/Si-based surfactant. Note that the fluorine-containing surfactant and the Si-based surfactant are preferably nonionic surfactants.

The "fluorine-containing/Si-based" means that the surfactant has features of both of fluorine-containing and Si-based surfactants.

By using this sort of surfactant, it is now able to solve problems regarding coating failure such as striation or scaly pattern (non-uniform drying of resist) which possibly occur when the curable composition for imprints is coated over a silicon wafer for manufacturing semiconductor device, glass square substrate for manufacturing liquid crystal display device, and substrates having formed thereon various films including chromium film, molybdenum film, molybdenum alloy film, tantalum film, tantalum alloy film, silicon nitride film, amorphous silicon film, tin oxide doped indium oxide (ITO) film, and tin oxide film. In particular, the under layer film-forming composition of the present invention added with the surfactant may largely be improved in the uniformity of coating, and may achieve appropriate coating characteristics in coating using a spin coater or slit scan coater, irrespective of the size of substrate.

Examples of the nonionic fluorine-containing surfactant usable in the present invention include Fluorad FC-430 and FC-431 (trade names, from Sumitomo 3M Ltd.), Surflon S-382 (trade name, from Asahi Glass Co., Ltd.), EFTOP EF-122A, 122B, 122C, EF-121, EF-126, EF-127 and MF-100 (from Tohkem Products Corporation), PF-636, PF-6320, PF-656 and PF-6520 (trade names, all from OMNOVA Solutions, Inc.), Ftergent FT250, FT251 and DFX18 (trade names, all from NEOS Co., Ltd.), Unidyne DS-401, DS-403 and DS-451 (trade names, all from Daikin Industries Ltd.), and Megafac 171, 172, 173, 178K, 178A and F780F (trade names, all from DIC Corporation).

Examples of the nonionic Si-containing surfactant include SI-10 Series (trade name, from Takemoto Oil & Fat Co., Ltd.), Megafac (from DIC Corporation), and KP-341 (from Shin-Etsu Chemical Co., Ltd.).

Examples of the fluorine and silicon-containing surfactant include X-70-090, X-70-091, X-70-092 and X-70-093 (trade names, all from Shin-Etsu Chemical Co., Ltd.), and Megafac R-08 and XRB-4 (trade names, all from DIC Corporation).

—Antioxidant—

Preferably, the curable composition for imprints used in the invention contains a known antioxidant. The content of the antioxidant to be in the composition is, for example, from 0.01 to 10% by mass of the total amount of the polymerizable monomers constituting the composition, preferably from 0.2 to 5% by mass. When two or more different types of antioxidants are in the composition, the total amount thereof falls within the above range.

The antioxidant is for preventing fading by heat or photoirradiation, and for preventing fading by various gases such as ozone, active hydrogen NOx, SOx (x is an integer), etc. Especially in the invention, the antioxidant added to the composition brings about the advantage that the cured film is prevented from being discolored and the film thickness is prevented from being reduced through decomposition. The antioxidant includes hydrazides, hindered amine-type antioxidants, nitrogen-containing heterocyclic mercapto compounds, thioether-type antioxidants, hindered phenol-type antioxidants, ascorbic acids, zinc sulfate, thiocyanates, thiourea derivatives, saccharides, nitrites, sulfites, thiosulfates, hydroxylamine derivatives, etc. Of those, preferred are hindered phenol-type antioxidants and thioether-type antioxidants from the viewpoint of their effect of preventing cured film discoloration and preventing film thickness reduction.

Commercial products of the antioxidant usable herein include Irganox 1010, 1035, 1076, 1222 (all by BASF GmbH); Antigene P, 3C, FR, Sumilizer S, Sumilizer GA80 (by Sumitomo Chemical); Adekastab A070, A080, A0503 (by Adeka), etc. These may be used either singly or as combined.

—Polymerization Inhibitor—

Furthermore, the curable composition for imprints used in the invention preferably comprises a polymerization inhibitor. The content of the polymerization inhibitor is from 0.001 to 1% by mass, more preferably from 0.005 to 0.5% by mass, and even more preferably from 0.008 to 0.05% by mass, relative to all the polymerizable monomers, and the change in the viscosities over time can be inhibited while maintaining a high curing sensitivity by blending the polymerization inhibitor in an appropriate amount. The polymerization inhibitor may be added at the production of the polymerizable monomer or may be added the curable composition for imprints after the production of the polymerizable monomer.

The polymerization inhibitor preferably used in the present invention is exemplified by hydroquinone, p-methoxyphenol, di-tert-butyl-p-cresol, pyrrogallol, tert-butylcatechol, benzoquinone, 4,4'-thiobis(3-methyl-6-tert-butylphenol), 2,2'-methylenebis(4-methyl-6-tert-butylphenol), cerous N-nitrosophenylhydroxyamine, phenothiazine, phenoxazine, 4-methoxynaphthol, 2,2,6,6-tetramethylpiperidine-1-oxyl free radical, 2,2,6,6-tetramethylpiperidine, 4-hydroxy-2,2,6,6-tetramethylpiperidine-1-oxyl free radical, nitrobenzene, and dimethylaniline. In particular, phenothiazine, 4-methoxynaphthol, 2,2,6,6-tetramethylpiperidine-1-oxyl free radical, 2,2,6,6-tetramethylpiperidine, and 4-hydroxy-2,2,6,6-tetramethylpiperidine-1-oxyl free radical, which are highly effective even in the absence of oxygen, are preferable.

—Solvent—

A solvent may be used for the curable composition for imprints used in the invention, in accordance with various needs. In particular, when a pattern having a thickness of at most 500 nm is formed, the composition preferably contains a solvent. Preferably, the solvent has a boiling point at normal pressure of from 80 to 200° C. Regarding the type of the solvent, any solvent capable of dissolving the composition may be used. Preferred are solvents having at least any one of an ester structure, a ketone structure, a hydroxyl group and an ether structure. Concretely, the solvent is preferably one or more selected from propylene glycol monomethyl ether acetate, cyclohexanone, 2-heptanone, gamma-butyrolactone, propylene glycol monomethyl ether, ethyl lactate. Most preferred is a solvent containing propylene glycol monomethyl ether acetate as securing coating uniformity.

The content of the solvent in the composition for imprints used in the present invention may be suitably optimized depending on the viscosity of the constitutive ingredients except the solvent, the coatability of the composition and the intended thickness of the film to be formed. From the viewpoint of the coatability, the solvent content is preferably from 0 to 99% by mass of the composition. When the composition for imprints used in the present invention is applied onto the substrate by inkjet method, it is preferred that the composition does not substantially contain a solvent (for example 3% by mass or less, preferably 1% by mass or less). On the other hand, when a pattern having a film thickness of 500 nm or less is formed by spin-coating method or the like, the content may be 20 to 99% by mass, preferably 40 to 99% by mass, specifically preferably 70 to 98% by mass.

—Polymer Ingredient—

The curable composition for imprints used in the invention may contain a poly-functional oligomer having a larger molecular weight than that of the above-mentioned, other poly-functional monomer within a range capable of attaining the object of the invention, for the purpose of further increasing the crosslinking density of the composition. Examples of the photoradical-polymerizable poly-functional oligomer include various acrylate oligomers such as polyester acrylates, urethane acrylates, polyether acrylates, epoxy acrylates. The amount of the oligomer ingredient to be added to the composition may be preferably from 0 to 30% by mass of the composition except the solvent therein, more preferably from 0 to 20% by mass, even more preferably from 0 to 10% by mass, most preferably from 0 to 5% by mass.

The curable composition for imprints for imprints used in the present invention may further contain a polymer component, in view of improving the dry etching resistance, imprint suitability and curability. The polymer component preferably has a polymerizable functional group in the side chain thereof. Weight-average molecular weight of the polymer component is preferably 2,000 to 100,000, and more preferably 5,000 to 50,000, in view of compatibility with the polymerizable monomer. Amount of addition of the polymer component, with respect to portion of the composition excluding the solvent, is preferably 0 to 30% by mass, more preferably 0 to 20% by mass, and most preferably 2% by mass or less. Pattern formability may be improved by adjusting the content of polymer component having a molecular weight of 2,000 or larger, with respect to the portion of the curable composition for imprints of the present invention excluding the solvent. From the viewpoint of pattern formability, as least as possible amount of resin component is preferable, and therefore the curable composition preferably contains no polymer component other than those composing the surfactant or trace amounts of additives.

In addition to the above-mentioned ingredients, the curable composition for imprints used in the invention may contain, if desired, UV absorbent, light stabilizer, antiaging agent, plasticizer, adhesion promoter, thermal polymerization initiator, colorant, elastomer particles, photoacid enhancer, photobase generator, basic compound, flowability promoter, defoaming agent, dispersant, etc.

The curable composition for imprints of the present invention may be prepared by mixing the individual components described in the above. Mixing and dissolution are generally proceeded in the temperature range from 0 to 100° C.

The curable composition prepared by mixing the individual components is preferably filtered, typically through a filter with a pore size of 0.003 μm to 5.0 μm, and more preferably 0.01 to 1.0 μm. The filtration may be proceeded in a multi-stage manner, or may be repeated a large number of times. The filtrate may be re-filtered. Material for composing a filter used for filtration may be polyethylene resin, polypropylene resin, fluorine-containing resin, nylon resin or the like, but not specifically limited.

In the curable composition for imprints used in the present invention, a mixture of the total components excluding the solvent preferably has a viscosity of 100 mPa·s or smaller, more preferably 1 to 70 mPa·s, furthermore preferably 2 to 50 mPa·s, and most preferably 3 to 30 mPa·s.

The curable composition for imprints used in the present invention after manufacturing is bottled in containers such as gallon bottles or coated bottles, and transported or stored. In this case, the inner space of the containers may be replaced with an inert gas such as nitrogen or argon, for the purpose of preventing deterioration. While the curable composition for imprints may be transported or stored at normal temperature, it is also preferable to control the temperature in the range from −20° C. to 0° C. for the purpose of preventing denaturation. Of course, the curable composition for imprints may be shielded from light up to a level of suppressing the reaction from proceeding.

[Pattern-Forming Method]

Next, a method of forming a pattern (in particular, fine irregularity pattern) using the curable composition for imprints of the present invention will be explained. According to the pattern forming method of the present invention, the fine irregular pattern may be formed by implementing the steps of placing the curable composition for imprints of the present invention onto a substrate, to thereby form a pattern-forming layer; pressing a mold onto the surface of the pattern-forming layer; and irradiating light onto the pattern-forming layer, to thereby cure the composition of the present invention.

It is now preferable that the curable composition for imprints of the present invention is cured by further heating it after the photo-irradiation. More specifically, the pattern-forming layer composed of at least the composition of the present invention is placed on the substrate (base or support), and is dried as necessary so as to form a layer (pattern-forming layer) composed of the composition of the present invention, to thereby manufacture a pattern acceptor (the substrate having the pattern-forming layer provided thereon), the mold is pressed onto the surface of the pattern-forming layer of the pattern accepter, the mold, pattern is transferred, and the layer for forming the fine irregularity pattern is cured by photo-irradiation. The photoimprinting lithography according to the pattern forming method of the present invention can afford stacking or multiple patterning, and also may be used in combination with the general thermal imprinting.

The curable composition for imprints of the present invention can form, by the photo-nanoimprinting process, a fine pattern at a low cost. Accordingly, it is now possible to form the fine pattern with still higher accuracy at a lower cost as compared with those which have been manufactured by the conventional photolithographic technique. For example, the composition of the present invention may be used as a permanent film such as an overcoat layer and insulating film directed for use in liquid crystal display (LCD) and so forth, and as an etching resist for semiconductor integrated circuit, recording material, flat panel display and so forth, by coating it on a substrate or support, and then subjecting the layer of the composition to exposure to light, curing and optional drying (baking). In particular, the pattern formed by using the curable composition for imprints of the present invention is excellent in the etching resistance, and is successfully used as an etching resist for dry etching using fluorocarbon or the like.

In permanent films (resists for structural members) for use in liquid-crystal displays (LCD) and in resists for use for substrate processing for electronic materials, the resist is preferably prevented from being contaminated as much as possible with metallic or organic ionic impurities in order that the resist does not interfere with the performance of the products. Accordingly, the concentration of the metallic or organic ionic impurities in the curable composition for imprints of the invention is preferably at most 1 ppm, more preferably at most 100 ppb, even more preferably at most 10 ppb.

In the following paragraphs, the pattern-forming method (pattern transfer method) using the curable composition for imprints of the present invention will be described specifically.

In the pattern forming method of the present invention, first, the composition of the present invention is applied over the substrate, to form the pattern-forming layer.

Methods of applying the curable composition for imprints of the present invention over the substrate is arbitrarily selectable from those well known to the public.

The methods of application usable in the present invention include dip coating, air knife coating, curtain coating, wire bar coating, gravure coating, extrusion coating, spin coating, slit scanning, and ink jet method, by which a coated film or liquid droplets may be applied to the substrate. Thickness of the pattern-forming layer composed of the composition of the present invention is 0.03 μm to 30 μm or around, which may vary depending on for which application the layer will be used. Alternatively, the composition of the present invention may be coated by multiple coating. In the method of placing the liquid droplets on the substrate typically by the ink jet method, volume of droplets is preferably 1 pl to 20 pl or around. The droplets are preferably arranged so as to be spaced from each other on the substrate. It is also preferable to form other organic layer such as a planarizing layer, between the substrate and the pattern-forming layer composed of the composition of the present invention. Since the pattern-forming layer and the substrate are therefore not brought in direct contact with each other, so that the substrate may be prevented from dust adhesion and damage. Note that, even when the organic layer is provided on the substrate, the pattern formed by using the composition of the present invention exhibits a good adhesiveness to the organic layer.

The substrate (base or support) on which the curable composition for imprints of the present invention is coated is selectable depending on various applications, and is exemplified by, but not specifically limited to, quartz, glass, optical film, ceramic material, vacuum deposited film, magnetic film, reflective film, metal substrate made of Ni, Cu, Cr, Fe or the like, paper, SOG (Spin On Glass), polymer substrates such as polyester film, polycarbonate film, polyimide film or the like, TFT array substrate, electrode plate of PDP, glass or translucent plastic substrate, electro-conductive substrate made of ITO, metal or the like, insulating substrate, and semiconductor manufacturing substrate made of silicon, silicon nitride, polysilicon, silicon oxide, amorphous silicon or the like. The shape of the substrate is not also specifically defined, and may be any of a tabular substrate or a roll substrate. The substrate may be selectable from translucent and non-translucent ones, depending on combination with the mold as described later.

Next, in the pattern forming method of the present invention, the mold is pressed onto the surface of the pattern-forming layer, in order to transfer the pattern to the pattern-forming layer. In this way, a fine pattern preliminarily formed on the surface to be pressed of the mold may be transferred to the pattern-forming layer.

Alternatively, the composition of the present invention may be coated on the mold having the pattern formed thereon, and the substrate may be pressed thereto.

The mold material usable in the invention is described. In the photoimprint lithography with the composition for imprints of the invention, a light-transmissive material is selected for at least one of the mold material and/or the substrate. In the photoimprint lithography applied to the invention, the curable composition for imprints of the invention is applied onto a substrate to form a patterning layer thereon, and a light-transmissive mold is pressed against the surface of the layer, then this is irradiated with light from the back of the mold and the patterning layer is thereby cured. Alternatively, the curable composition for photoimprints is applied onto a light-transmissive substrate, then a mold is pressed against it, and this is irradiated with light from the back of the substrate whereby the curable composition for photoimprints can be cured.

The photoirradiation may be attained while the mold is kept in contact with the layer or after the mold is released. In the invention, preferably, the photoirradiation is attained while the mold is kept in contact with the patterning layer.

The mold usable in the present invention is a mold having formed thereon a pattern to be transferred. The pattern on the mold may be formed for example by photolithography, electron beam lithography or the like, depending on a desired level of process accuracy. In the present invention, methods of forming the mold pattern are not specifically limited.

Not specifically defined, the light-transmissive mold material for use in the invention may be any one having a desired strength and durability. Concretely, its examples include glass, quartz, light-transparent resin such as PMMA or polycarbonate resin, transparent metal deposition film, flexible film of polydimethylsiloxane or the like, photocured film, metal film, etc.

The non-light-transmissive mold to be used in the invention where a light-transmissive substrate is used is not also specifically defined and may be any one having a predetermined strength. Concretely, examples of the mold material include ceramic material, deposition film, magnetic film, reflective film, metal material of Ni, Cu, Cr, Fe or the like, as well as SiC, silicon, silicon nitride, polysilicon, silicon oxide, amorphous silicon, etc. However, these are not limitative. The shape of the mold is not also specifically defined, and may be any of a tabular mold or a roll mold. The roll mold is used especially when continuous transfer in patterning is desired.

The mold for use in the patterning method of the invention may be processed for surface release treatment for the purpose of enhancing the releasability of the curable composition for imprints from the mold. The mold of the type includes those surface-treated with a silicone-type or fluorine-containing silane coupling agent, for which, for example, commercial release agents such as Daikin's Optool DSX, Sumitomo 3M's Novec EGC-1720 and others are preferred.

In photoimprint lithography with the curable composition for imprints, in general, the mold pressure in the patterning method of the invention is preferably at most atmospheres. When the mold pressure is at most 10 atmospheres, then the mold and the substrate are hardly deformed and the patterning accuracy tends to increase. It is also favorable since the pressure unit may be small-sized since the pressure to be given to the mold may be low. The mold pressure is preferably selected from the region capable of securing the mold transfer uniformity, within a range within which the residual film of the curable composition for imprints in the area of mold pattern projections may be reduced.

In the patterning method of the invention, the dose of photoirradiation in the step of irradiating the patterning layer with light may be sufficiently larger than the dose necessary for curing. The dose necessary for curing may be suitably determined depending on the degree of consumption of the unsaturated bonds in the curable composition for imprints and on the tackiness of the cured film as previously determined.

In the imprint lithography applied to the present invention, photo-irradiation is conducted while keeping the substrate temperature generally at room temperature, wherein the photo-irradiation may alternatively be conducted under heating for the purpose of enhancing the reactivity. Also photo-irradiation in vacuo is preferable, since a vacuum conditioning prior to the photo-irradiation is effective for preventing entrainment of bubbles, suppressing the reactivity from being reduced due to incorporation of oxygen, and for improving the adhesiveness between the mold and the curable composition for imprints. In the method of forming a pattern according to the present invention, the degree of vacuum in the process of photo-irradiation is preferably in the range from $10^{-1}$ Pa to normal pressure.

Light to be used for photoirradiation to cure the curable composition for imprints of the invention is not specifically defined. For example, it includes light and irradiations with a wavelength falling within a range of high-energy ionizing radiation, near-ultraviolet, far-ultraviolet, visible, infrared, etc. The high-energy ionizing radiation source includes, for example, accelerators such as Cockcroft accelerator, Handegraf accelerator, linear accelerator, betatoron, cyclotron, etc. The electron beams accelerated by such an accelerator are used most conveniently and most economically; but also are any other radioisotopes and other radiations from nuclear reactors, such as $\gamma$ rays, X rays, $\alpha$ rays, neutron beams, proton beams, etc. The UV sources include, for example, UV fluorescent lamp, low-pressure mercury lamp, high-pressure mercury lamp, ultra-high-pressure mercury lamp, xenon lamp, carbon arc lamp, solar lamp, etc. The radiations include microwaves, EUV, etc. In addition, laser rays for use in microprocessing of semiconductors, such as LED, semiconductor laser ray, 248 nm KrF excimer laser ray, 193 nmArF excimer laser ray and others, are also favorably used in the invention. These lights may be monochromatic lights, or may also be lights of different wavelengths (mixed lights).

In photoexposure, the light intensity is preferably within a range of from 1 mW/cm$^2$ to 50 mW/cm$^2$. When the light intensity is at least 1 mW/cm$^2$, then the producibility may increase since the photoexposure time may be reduced; and when the light intensity is at most 50 mW/cm$^2$, then it is favorable since the properties of the permanent film formed may be prevented from being degraded owing to side reaction. Also preferably, the dose in photoexposure is within a range of from 5 mJ/cm$^2$ to 1000 mJ/cm$^2$. When the dose is less than 5 mJ/cm$^2$, then the photoexposure margin may be narrow and there may occur problems in that the photocuring may be insufficient and the unreacted matter may adhere to mold. On the other hand, when the dose is more than 1000 mJ/cm$^2$, then the composition may decompose and the permanent film formed may be degraded.

Further, in photoexposure, the oxygen concentration in the atmosphere may be controlled to be less than 100 mg/L by introducing an inert gas such as nitrogen or argon into the system for preventing the radical polymerization from being retarded by oxygen.

In the patterning method of the invention, after the pattern layer (a layer comprising the curable composition for imprints layer) is cured through photoirradiation, if desired, the cured pattern may be further cured under heat given thereto. The method may additionally includes the post-curing step. Thermal curing of the composition of the invention after photoirradiation is preferably attained at 150 to 280° C., more preferably at 200 to 250° C. The heating time is preferably from 5 to 60 minutes, more preferably from 15 to 45 minutes.

[Pattern]

The pattern formed by the pattern forming method of the present invention as described above is usable as permanent films used in liquid crystal display (LCD) and so forth (resist for structural components), or as an etching resist. The pattern formed by the pattern forming method of the present invention is excellent in heat resistance and dielectric characteristics, and is useful as an insulating material. By removing a residual portion of the pattern formed by the pattern forming method of the present invention, and then filling an interconnect material such as copper, it is now possible to fabricate devices without relying upon complicated photolithography and etching processes. In addition, the present invention enables formation of a rectangular pattern faithful to the mold, so that even a multi-step interconnect pattern (dual damascene), which have been formed generally by repeating photolithography and etching, may be formed by a reduced number of processes, by using the curable composition of the present invention, forming a pattern using a mold having a multi-step pattern, and using the thus obtained pattern as an insulating film.

The pattern formed by the pattern forming method of the present invention is also useful as an etching resist. When the composition for imprints of the present invention is used as the etching resist, first, for example a silicon wafer having formed thereon a film of SiO$_2$ or the like is got as a substrate, and a fine pattern on the order of nanometers is formed on the substrate according to the pattern forming method of the present invention. Thereafter, by etching the film by wet etching using hydrogen fluoride or the like, or by dry etching with an etching gas such as CF$_4$, a desired pattern may be formed on the substrate. The curable composition of the present invention exhibits a good etching resistance particularly in dry etching using an oxygen-containing gas.

EXAMPLE

The characteristics of the invention are described more concretely with reference to Production Examples and Examples given below. In the following Examples, the material used, its amount and the ratio, the details of the treatment and the treatment process may be suitably modified or changed not overstepping the scope of the invention. Accordingly, the invention should not be limitatively interpreted by the Examples mentioned below.

Example A

Synthesis of Polymerizable Compound Ax1-1

Fifteen grams of polydimethylsiloxane (KF-8010, from Shin-Etsu Chemical Co., Ltd., functional equivalent weight=430 g/mol) having an aminopropyl group at the terminal was dissolved in 50 ml of NMP, the solution was ice-cooled and slowly added with a solution prepared by dissolving 3.76 g of maleic anhydride into 30 ml of NMP. The mixture was stirred at room temperature for 2 hours, added with 200 ml of ethyl acetate, followed by washing with water, drying and concentration. The obtained oily substance was added with 40 ml of acetic anhydride and 4.15 g of sodium acetate, and allowed to react at 85° C. for 7 hours. The reaction liquid was poured into icy water, the mixture was stirred for one hour, extracted with ethyl acetate, dried, and concentrated to obtain an oily matter. The product was purified by column chromatography, to obtain 5 g of polymerizable compound Ax1-1. Average value of the number of dimethylsiloxane repeating units s1 was determined to be 11 by NMR, and the number average molecular weight was found to be 916.

Synthesis of Polymerizable Compound Ax2-1

Polymerizable compound Ax2-1 was synthesized by procedures similar to those for synthesizing the polymerizable compound Ax1-1, except that 1,3-bis(aminopropyl)tetramethyldisiloxane was used in place of polydimethylsiloxane. The polymerizable compound Ax2-1 appeared as a solid, with a melting point of 49° C.

Synthesis of Polymerizable Compound Ax4-1

In 200 ml of ethyl acetate, 9.8 g of maleic anhydride was dissolved, the mixture was ice-cooled, and therein 22.1 g of aminopropyltriethoxysilane was dropped under cooling on ice. The mixture was allowed to react at room temperature for 2 hours, and the solvent was condensed, to obtain 32 g of colorless solid.

In methanol, 21.9 g of 1,3-divinyltetramethyldisiloxane was dissolved, and then added with 0.46 g of concentrated sulfuric acid under cooling on ice. The mixture was stirred for 30 minutes under cooling on ice, and 15 g of the colorless solid obtained above was added. After one hour of stirring under cooling on ice, the mixture was added with 3.4 g of water, and then allowed to react at room temperature for 4 hours. The aqueous phase was removed from the reaction liquid, and the residue was added with 1.15 g of concentrated sulfuric acid, and the mixture was stirred at room temperature for 30 minutes. The reaction liquid was added with 200 ml of ethyl acetate, washed with water, dried, and then concentrated to obtain 21 g of oil. Ten grams of the thus obtained oil was added with 20 ml of acetic anhydride and 2.1 g of sodium acetate, and the mixture was allowed to react at 80° C. for 4 hours. The reaction liquid was poured into ice, the mixture was stirred for one hour, extracted with ethyl acetate, dried, and concentrated to obtain an oily substance. The product was purified by column chromatography, to obtain 3 g of polymerizable compound Ax4-1.

Synthesis of Polymerizable Compound Ax6-1

Polymerizable compound Ax6-1 was synthesized by procedures similar to those for synthesizing the polymerizable compound Ax4-1, except that hexamethyldisiloxane was used in place of 1,3-divinyltetramethyldisiloxane.

By similar procedures, also polymerizable compounds Ax3-1 and Ax7-1 were synthesized. Ax5-1 was commercially available from Aldrich. Ax8-1 was synthesized from hydroxypropylmaleimide and acrylic acid chloride.

Preparation of Curable Composition

The materials listed in Table below were mixed, and further added with 100 ppm (0.01% by mass), relative to the polymerizable compound, of 4-hydroxy-2,2,6,6-tetramethylpiperidine-1-oxyl free radical (from Tokyo Chemical Industry Co., Ltd.) as a polymerization inhibitor, to thereby obtain curable compositions A1 to A12 of the present invention, and curable compositions B1 to B3 of Comparative Examples.

[Chemical Formula 42]

Ax1-1

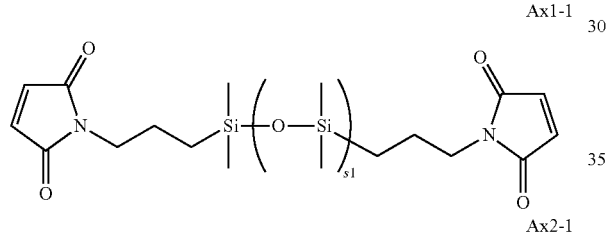

Ax2-1

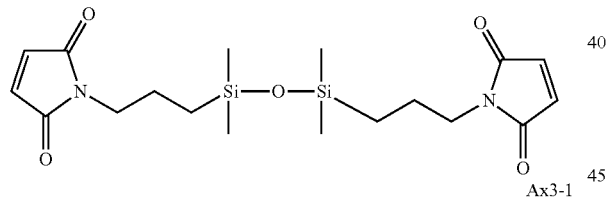

Ax3-1

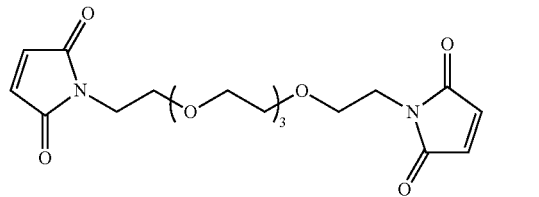

Ax4-1

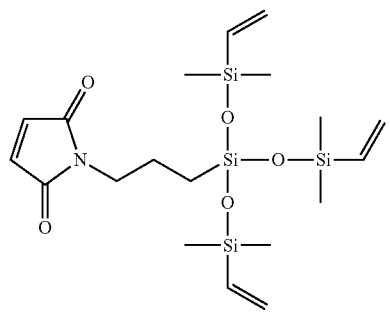

-continued

Ax5-1

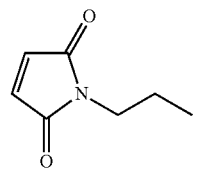

Ax6-1

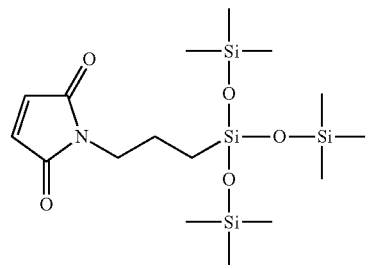

Ax7-1

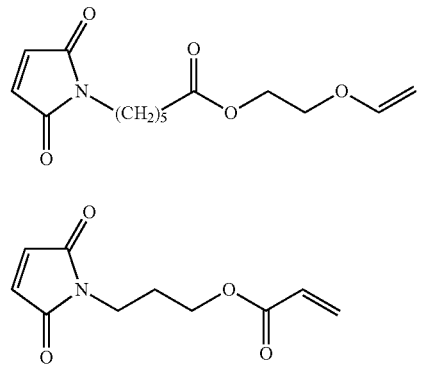

Ax8-1

Melting points of these compounds are as follow:

Ax1-1: liquid at 25° C.

Ax2-1: 49° C.

Ax3-1: liquid at 25° C.

Ax4-1: liquid at 25° C.

Ax5-1: 28° C.

Ax6-1: liquid at 25° C.

Ax7-1: liquid at 25° C.

Ax8-1: liquid at 25° C.

K1: 2,4,6-trimethylbenzoylphenylethoxyphosphine oxide (Lucirin TPO-L, from BASF GmbH)

K2: (2-dimethylamino-2-(4-methylbenzyl)-1-(4-morpholin-4-ylphenyl)butane-1-one (Irgacure 379EG, from BASF GmbH)

[Chemical Formula 43]

R1-1

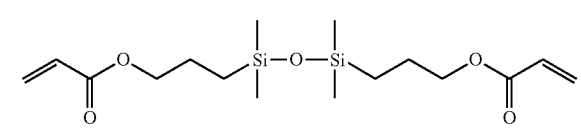

-continued

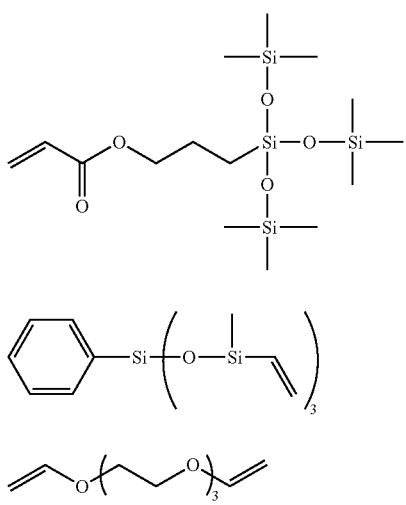

R1-1: synthesized from 1,3-bis(chloropropyl)tetramethyldisiloxane and acrylic acid
R2-1: SIA0210, from Gelest, Inc.
R3-1: SIT8725, from Gelest, Inc.
R4-1: triethylene glycol divinyl ether, from Aldrich <Heat Resistance Test of Pattern>

As a mold, used was a quartz mold having a rectangular line/space pattern (1/1) with a line width of 40 nm and a groove depth of 60 nm, and treated over the surface thereof with Optool DSX (from Daikin Industries, Ltd.).

Over a silicon substrate treated with KBM-5103 from Shin-Etsu Chemical Co., Ltd., a plurality of 2-μl liquid droplets of the curable composition were arrayed in a square matrix with a pitch of 1 cm, and the mold was placed thereon to fill the mold with the liquid droplets. The curable composition was then allowed to cure in a nitrogen gas flow, while being irradiated by light of a mercury lamp at an irradiation energy of 500 mJ/cm². After the curing, the mold was released slowly to obtain a pattern.

Heat resistance test was conducted by heating the thus obtained pattern for one hour under the individual conditions of 300° C. and 350° C. in a nitrogen atmosphere, and 300° C. and 350° C. in the air. Pattern geometry after the heat resistance test was observed under a scanning electron microscope, and evaluated according to the criteria below:
A: square pattern faithful to the mold obtained;
B: rounded pattern top, with a pattern height of 90% or more of the groove depth of the mold;
C: rounded pattern top, with a pattern height of 70% or more and less than 90% of the groove depth of the mold;
D: rounded pattern top, with a pattern height of 50% or more and less than 70% of the groove depth of the mold; and
E: apparently rounded pattern top, with a pattern height of less than 50% of the groove depth of the mold.

TABLE 1

|  | A1 | A2 | A3 | A4 | A5 | A6 | A7 | A8 | A9 | A10 | A11 | A12 | B1 | B2 |
|---|---|---|---|---|---|---|---|---|---|---|---|---|---|---|
| Ax1-1 | 97 | 87 | 50 |  |  |  |  |  |  |  |  | 67 |  |  |
| Ax2-1 |  |  | 47 |  |  | 15 | 15 | 15 |  |  |  |  |  |  |
| Ax3-1 |  |  |  | 97 |  |  |  |  |  |  |  | 77 |  |  |
| Ax4-1 |  |  |  |  | 97 | 82 |  |  |  |  |  |  |  |  |
| Ax5-1 |  |  |  |  |  |  | 82 |  |  |  |  |  |  |  |
| Ax6-1 |  |  |  |  |  |  |  | 82 |  |  |  |  |  |  |
| Ax7-1 |  |  |  |  |  |  |  |  | 97 |  |  |  |  |  |
| Ax8-1 |  |  |  |  |  |  |  |  |  | 97 |  |  |  |  |
| K1 | 3 | 3 | 3 | 3 | 3 | 3 | 3 | 3 | 3 | 3 |  |  | 3 | 3 |
| K1 |  |  |  |  |  |  |  |  |  |  |  | 3 |  |  |
| R1-1 |  |  |  |  |  |  |  |  |  |  | 30 |  | 97 | 20 |
| R2-1 |  |  |  |  |  |  |  |  |  |  |  |  |  | 77 |
| R3-1 |  | 10 |  |  |  |  |  |  |  |  |  |  |  |  |
| R4-1 |  |  |  |  |  |  |  |  |  |  |  | 10 |  |  |
| R5-1 |  |  |  |  |  |  |  |  |  |  |  |  |  |  |
| In a nitrogen atmosphere, 300° C. | A | A | A | A | A | A | B | A | A | B | B | A | B | C |
| In the air, 300° C. | B | B | A | B | A | A | B | B | B | B | B | B | C | C |
| In a nitrogen atmosphere, 350° C. | B | B | B | B | A | A | C | B | C | C | C | B | C | E |
| In the air, 350° C. | C | C | C | D | B | C | C | C | C | D | C | D | E | E |

Using the curable composition A5 of the present invention and an ink jet printer DMP-2831 from FUJIFILM Dimatix, Inc. used as an ink jet device, the photocurable composition was ejected onto a silicon wafer treated with KBM-5103 from Shin-Etsu Chemical Co., Ltd., with a droplet volume per nozzle of 1 pl, while controlling timing of ejection so as to array the droplets in a square matrix with a pitch of 100 μm. In this process, temperature of the curable composition to be ejected was adjusted to 25° C. Viscosity of the curable composition A5 at 25° C. was found to be 12 mPa·s. Onto the wafer, a quartz mold having a rectangular line/space pattern (1/1) with a line width of 25 nm and a groove depth of 40 nm, and treated over the surface thereof with Optool DSX (from Daikin Industries, Ltd.) was placed, and allowed the droplets to fill the mold. The curable composition was then allowed to cure in a nitrogen gas flow, while being irradiated by light of a mercury lamp from the mold side, under a condition of 500 mJ/cm². After the curing, the mold was released slowly to obtain a pattern.

The thus obtained pattern was subjected to the heat resistance test same as that the 40 nm pattern described above was tested. The same results with those of the 40 nm pattern were obtained.

A cured film was obtained using the curable composition A5 of the present invention, by the procedures same as those in the heat resistance test described above, except that a flat mold being free from pattern was used. Dielectric constant of the cured film, measured by the mercury probe methods, was found to be 2.8, proving its adequacy as a low-dielectric constant material usable for insulating film and so forth.

As is clear from the results shown above, not only a patternability as fine as 100 nm or below, but also a high level of heat resistance were found to be achieved by using the compositions of the present invention.

Example B

The polymerizable compounds and polymerization initiators shown in Table below were mixed, and 4-hydroxy-2,2,6,6-tetramethylpiperidine-1-oxyl free radical (from Tokyo Chemical Industry Co., Ltd.) was further added as the polymerization inhibitor, while adjusting the content thereof, relative to the polymerizable compound, to 100 ppm (0.01% by mass). The thus prepared compositions were filtered through a 0.1 μm tetrafluoroethylene filter, to obtain the curable compositions.

(Evaluation)

The thus obtained curable compositions of the individual Examples and Comparative Examples were evaluated in terms of the properties below. Results were shown in Table below.

<Weight Loss>

A film of each composition was formed by coating on a tetrafluoroethylene sheet, and then allowed to cure by irradiating light of a mercury lamp in a nitrogen atmosphere, at an illuminance of 10 mW/cm² and an exposure energy of 600 mJ/cm². The cured film was taken out, then heated at 350° C. for 2 hours in the air, using a TGA apparatus Q500 from TA Instruments, and weight loss was measured. The fewer the ratio of weight loss, the better the heat resistance.

<Heat Resistance Test of Pattern>

As a mold, used was a quartz mold having a rectangular line/space pattern (1/1) with a line width of 80 nm and a groove depth of 150 nm, and treated over the surface thereof with Optool DSX (from Daikin Industries, Ltd.).

Over a silicon substrate, the curable composition was spin-coated to form a pattern-forming layer of 1.5 μm thick. Under a nitrogen gas flow, the mold was placed thereon, and the composition was allowed to cure by irradiating light of a mercury lamp of 365 nm, while keeping the mold pressed onto the composition at a pressure of 1 MPa, at an illuminance of 10 mW/cm² and an exposure energy of 300 mJ/cm². After the curing, the mold was released slowly to obtain a pattern.

The thus obtained pattern was subjected to the heat resistance test under heating in the air at 300° C. for 2 hours. Pattern geometry after the heat resistance test was observed under a scanning electron microscope, and evaluated according to the criteria below:

A: square pattern faithful to the mold obtained;
B: slightly rounded pattern top, with faithful pattern height;
C: apparently rounded pattern top, with faithful pattern height;
D: apparently rounded pattern top, with reduced pattern height.

TABLE 2

| | Example 1 | Example 2 | Example 3 | Example 4 | Example 5 | Example 6 | Example 7 | Example 8 | Example 9 | Example 10 | Example 11 | Example 12 | Example 13 | Comparative Example 1 | Comparative Example 2 | Comparative Example 3 |
|---|---|---|---|---|---|---|---|---|---|---|---|---|---|---|---|---|
| Ax1-2 | 97 | 77 | 30 | | 10 | | | | 87 | 92 | 47 | 47 | 47 | | | |
| Ax2-2 | | | | | | 77 | 47 | | | | | | | | | |
| Ax3-2 | | | | 30 | | | | 10 | | | | | | | | |
| Ax4-2 | | | | | | | | | | | 50 | 50 | 50 | | | |
| Ax5-2 | | | | | | | | | | | | | | | | |
| Ax6-2 | | | | | | | | | | | | | | | | |
| R1-2 | | 20 | 67 | 67 | 87 | 20 | | 87 | | | | | | | 20 | 97 |
| R2-2 | | | | | | | 50 | | | | | | | | | |
| R3-2 | | | | | | | | | 10 | | | | | | | |
| R4-2 | | | | | | | | | | 5 | | | | | | |
| Z1 | | | | | | | | | | | | | | 97 | 77 | |
| B1 | 3 | 3 | 3 | 3 | | 3 | | | 3 | 3 | 3 | 3 | 3 | 3 | 3 | |
| B2 | | | | | | | 3 | 3 | | | | | | | | 3 |
| Weight Loss(%) | 17 | 15 | 19 | 24 | 22 | 19 | 20 | 22 | 15 | 15 | 12 | 11 | 14 | 60 | 41 | 25 |
| Heat Resistance Test of Pattern | A | A | B | B | B | B | B | B | A | A | A | A | A | D | D | C |

TABLE 2-continued
| | Example 1 | Example 2 | Example 3 | Example 4 | Example 5 | Example 6 | Example 7 | Example 8 | Example 9 | Example 10 | Example 11 | Example 12 | Example 13 | Comparative Example 1 | Comparative Example 2 | Comparative Example 3 |
|---|---|---|---|---|---|---|---|---|---|---|---|---|---|---|---|---|
(AX) component
[Chemical Formula 44]
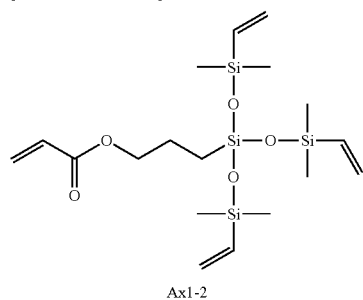
Ax1-2
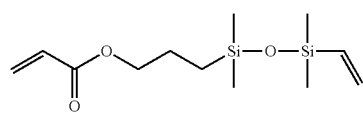
Ax2-2
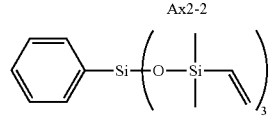
Ax3-2
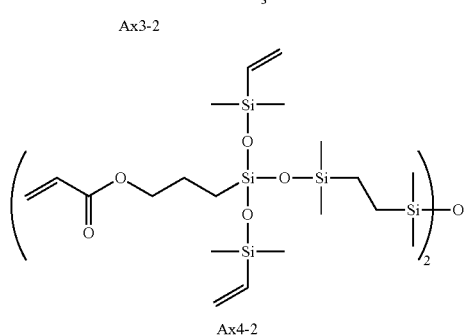
Ax4-2
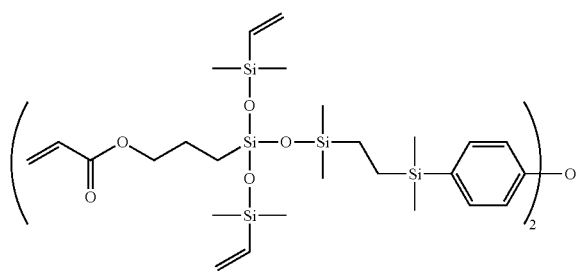
Ax5-2
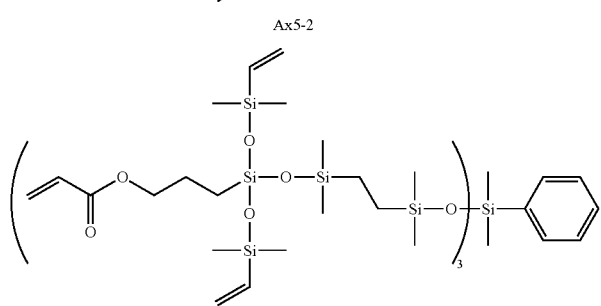
Ax6-2
(Other Component)
[Chemical Formula 45]

TABLE 2-continued

| | Example 1 | Example 2 | Example 3 | Example 4 | Example 5 | Example 6 | Example 7 | Example 8 | Example 9 | Example 10 | Example 11 | Example 12 | Example 13 | Comparative Example 1 | Comparative Example 2 | Comparative Example 3 |
|---|---|---|---|---|---|---|---|---|---|---|---|---|---|---|---|---|

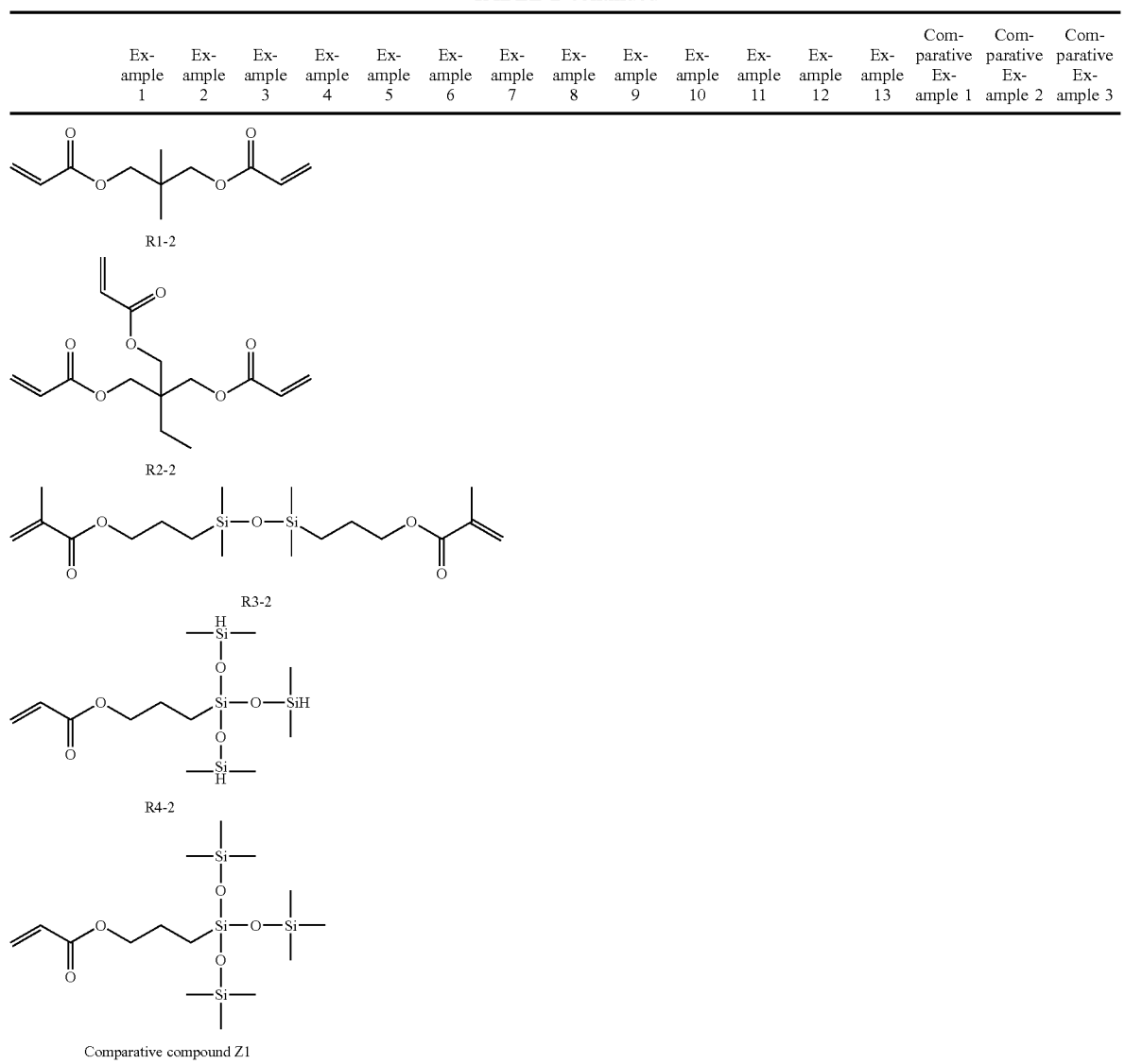

Synthesis of Ax1-2

Ninety-three grams of 1,3-divinyltetramethyldisiloxane was dissolved in 13 g of methanol, and the solution was slowly added with 2 g of concentrated sulfuric acid under cooling on ice. After 30 minutes of stirring, the solution was slowly added with 46 g of 3-acryloxypropyltrimethoxysilane, stirred at room temperature for one hour, added with 14 g of water, and allowed to react for 5 hours. The aqueous layer was separated, the organic layer was washed with water, the organic layer was added with 4.9 g of concentrated sulfuric acid, and stirred at room temperature for 30 minutes. The aqueous layer was removed, the organic layer was washed successively with water, aqueous sodium hydrogen carbonate solution and water, and then concentrated to obtain a crude product. The crude product was purified by reduced-pressure distillation to obtain 50 g of compound Ax1-2.

Synthesis of Ax2-2

Ax2-2 was synthesized similarly to Ax1-2, except that 3-acryloxypropyldimethylmethoxysilane was used in place of 3-acryloxypropyltrimethoxysilane.

Ax3-2: SIT8725, from Gelest, Inc.

Synthesis of Ax4-2

A 2:1 mixture, by molar ratio, of Ax1-2 and 1,1,3,3-tetramethyldisiloxane was mixed with toluene, and added with a xylene solution of platinum bis(1,3-divinyltetramethyldisiloxane) complex. The mixture was allowed to react at room temperature for 24 hours, and subjected to silica gel column chromatography, to thereby obtain compound Ax4-2.

Synthesis of Ax5-2

Ax5-2 was synthesized similarly to Ax4-2, except that SIB1091 from Gelest, Inc. was used in place of 1,1,3,3-tetramethyldisiloxane.

Synthesis of Ax6-2

Ax6-2 was synthesized similarly to Ax4-2, except that SIP6826 from Gelest, Inc. was used in place of 1,1,3,3-tetramethyldisiloxane.

R1-2: Kayarad NPGDA, from Nippon Kayaku Co., Ltd.
R2-2: Aronix M-309, from Toagosei Co., Ltd.
R3-2: SIB1402, from Gelest, Inc.
R4-2: synthesized by a method described in EP1424339
Z1: SIA0210, from Gelest, Inc.
<Photo-Polymerization Initiator>
B1: 2,4,6-trimethylbenzoylphenylethoxyphosphine oxide (Lucirin TPO-L, from BASF GmbH)
B2: (2-dimethylamino-2-(4-methylbenzyl)-1-(4-morpholin-4-yl phenyl)butane-1-one (Irgacure 379EG, from BASF GmbH)

As is clear from Table above, the compositions of the present invention were found to show good results both in the tests of weight loss and heat resistance of pattern. On the other hand, the compounds out of the scope of the present invention were found to show poor results both in the tests of weight loss and heat resistance of pattern.

The curable composition of the present invention was also found to be usable as a so-called low-k material, by virtue of its excellent heat resistance.

INDUSTRIAL APPLICABILITY

The curable composition of the present invention can keep a good pattern even heated at high temperatures (250° C. or above for example, and furthermore 300° C. or above), and is therefore preferably usable for applications regarding permanent films, particularly regarding insulating film, molding material and so forth.

The invention claimed is:

1. A curable composition for imprints comprising a polymerizable compound (Ax-1) having maleimide structure(s) and a photo-polymerization initiator (B), wherein:
the polymerizable compound (Ax-1) having maleimide structure(s) is a compound having two or more maleimide structures, or, a compound having a maleimide group and a polymerizable group other than maleimide group and being free from ester groups;
the polymerizable compound (Ax-1) has at least one silicon atom;
the at least one silicon atom is contained in a chain-like structure of the polymerizable compound (Ax-1); and
the content of a polymer having a molecular weight of 2,000 or more, based on the mass of the composition excluding solvent, is 30% by mass or less.

2. The curable composition for imprints of claim 1, wherein both of the compound having two or more maleimide structures and the compound having a maleimide group and a polymerizable group other than the maleimide group are free from ester groups.

3. The curable composition for imprints of claim 1, wherein the polymerizable compound (Ax-1) has a structure in which the at least one silicon atom is bonded to an oxygen atom.

4. The curable composition for imprints of claim 3, wherein the polymerizable compound (Ax-1) is free from hetero atoms other than a hetero atom contained in the maleimide structures or group and other than the oxygen atom bonded to the at least one silicon atom.

5. The curable composition for imprints of claim 1, wherein the polymerizable compound (Ax-1) has a molecular weight of 200 to 500.

6. The curable composition for imprints of claim 1, wherein the polymerizable group other than the maleimide group is a vinyl group bonded to the at least one silicon atom.

7. The curable composition for imprints of claim 1, wherein the polymerizable compound (Ax-1) is represented by formula (Ax-15):

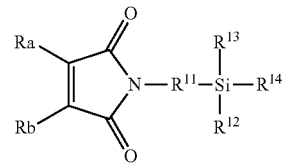

Formula (Ax-15)

in the formula (Ax-15), each of Ra and Rb independently represents a hydrogen atom or alkyl group, $R^{11}$ represents a linking group being free from hetero atoms, each of $R^{12}$ to $R^{14}$ independently represents an alkyl group, aryl group, vinyl group, or a group represented by —O—Si $(R^{15})(R^{16})(R^{17})$ and each of $R^{15}$ to $R^{17}$ independently represents an alkyl group, aryl group or vinyl group.

8. The curable composition for imprints of claim 1, wherein the polymerizable compound (Ax-1) is represented by formula (Ax-16):

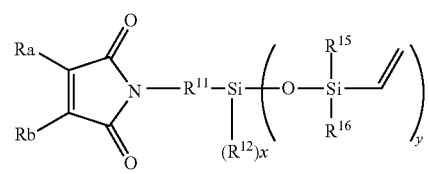

Formula (Ax-16)

in the formula (Ax-16), each of Ra and Rb independently represents a hydrogen atom or alkyl group, $R^{11}$ represents a linking group being free from hetero atoms, $R^{12}$ represents an alkyl group, aryl group, vinyl group, or a group represented by —O—Si $(R^{15})(R^{16})(R^{17})$, each of $R^{15}$ to $R^{17}$ independently represents an alkyl group, aryl group or vinyl group; x represents an integer of 0 to 2, and y represents an integer of 1 to 3, where x+y=3.

9. The curable composition for imprints of claim 1, wherein the content of a solvent in the composition is 3% by mass or less.

10. The curable composition for imprints of claim 1, wherein the content of the polymerizable compound (Ax-1) is 30 to 99% by mass of the total components excluding solvent.

11. The curable composition for imprints of claim 1, wherein the content of a polymer having a molecular weight of 2,000 or more, based on the mass of the composition excluding solvent, is 2% by mass or less.

12. The curable composition for imprints of claim 1, wherein the content of a solvent in the composition is 3% by mass or less; the content of the polymerizable compound (Ax-1) is 30 to 99% by mass of the total components excluding solvent; and the content of a polymer having a molecular weight of 2,000 or more, based on the mass of the composition excluding solvent, is 2% by mass or less.

13. A pattern-forming method using the curable composition for imprints described in claim 1.

14. A pattern-forming method comprising:
applying the curable composition for imprints described in claim 1 onto a substrate, to thereby form a pattern-forming layer;
pressing a mold onto the surface of the pattern-forming layer; and
irradiating light onto the pattern-forming layer.

15. A pattern obtained by the pattern-forming method described in claim 13.

16. An electronic device comprising the pattern described in claim 15.

17. A method of manufacturing an electronic device comprising the pattern-forming method described in claim 13.

18. A curable composition comprising a photo-polymerization initiator (B) and at least one of a polymerizable compound represented by formula (Ax-15), a compound represented by formula (Ax-16), or a compound having 2 to 6 (meth)acryloyloxy groups represented by formula (IV) below, wherein the content of a polymer having a molecular weight of 2,000 or more, based on the mass of the composition excluding solvent, is 30% by mass or less;

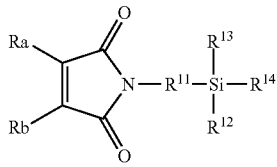

Formula (Ax-15)

in the formula (Ax-15), each of Ra and Rb independently represents a hydrogen atom or alkyl group, $R^{11}$ represents a linking group being free from hetero atom, each $R^{12}$ to $R^{14}$ independently represents an alkyl group, aryl group, vinyl group, or a group represented by —O—Si $(R^{15})(R^{16})(R^{17})$, and each of $R^{15}$ to $R^{17}$ independently represents an alkyl group, aryl group or vinyl group;

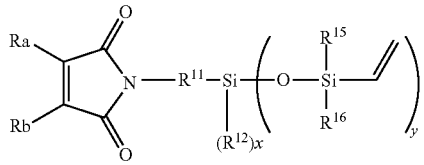

Formula (Ax-16)

in the formula (Ax-16), each of Ra and Rb independently represents a hydrogen atom or alkyl group, $R^{11}$ represents a linking group being free from hetero atoms, $R^{12}$ represents an alkyl group, aryl group, vinyl group, or a group represented by —O—Si $(R^{15})(R^{16})(R^{17})$, each of $R^{15}$ to $R^{17}$ independently represents an alkyl group, aryl group or vinyl group, x is an integer of 0 to 2, and y is an integer of 1 to 3, where x+y=3;

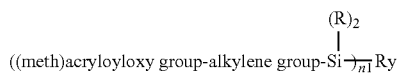

Formula (IV)

in the formula (IV), each R independently represents a methyl group or —O—Si$(CH_3)_2$—CH=$CH_2$, at least one of (R)s represents —O—Si$(CH_3)_2$—CH=$CH_2$, Ry represents an n1-valent linking group, and n1 represents 2 to 6.

* * * * *